United States Patent
Lee et al.

(10) Patent No.: US 11,824,117 B2
(45) Date of Patent: Nov. 21, 2023

(54) OXIDE SEMICONDUCTOR TRANSISTOR

(71) Applicant: Samsung Electronics Co., Ltd., Suwon-si (KR)

(72) Inventors: Kwanghee Lee, Hwaseong-si (KR); Sangwook Kim, Seongnam-si (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 17/308,543

(22) Filed: May 5, 2021

(65) Prior Publication Data

US 2021/0367080 A1 Nov. 25, 2021

(30) Foreign Application Priority Data

May 19, 2020 (KR) ......................... 10-2020-0059968

(51) Int. Cl.
*H01L 29/78* (2006.01)
*H01L 29/51* (2006.01)
*H01L 29/66* (2006.01)

(52) U.S. Cl.
CPC ...... *H01L 29/78391* (2014.09); *H01L 29/516* (2013.01); *H01L 29/6684* (2013.01)

(58) Field of Classification Search
CPC ............ H01L 29/78391; H01L 29/516; H01L 29/6684; H01L 29/7869; H01L 29/66969; H01L 29/78645; H01L 29/78696; H01L 29/0847; H01L 29/1037; H01L 29/41733; H01L 29/4236; H01L 29/78603; H01L 29/78648

USPC ........................................................ 257/295
See application file for complete search history.

(56) References Cited

U.S. PATENT DOCUMENTS

| | | | |
|---|---|---|---|
| 7,872,309 B2 | 1/2011 | Schuele et al. | |
| 9,472,664 B1 | 10/2016 | Wu | |
| 9,805,954 B2 | 10/2017 | Ishizuka et al. | |
| 9,853,150 B1 * | 12/2017 | Colinge | H01L 29/78391 |
| 9,871,112 B1 * | 1/2018 | Cheng | H01L 29/4966 |

(Continued)

FOREIGN PATENT DOCUMENTS

| | | | |
|---|---|---|---|
| JP | 4620046 B2 | 1/2011 | |
| JP | 4963252 B2 | 6/2012 | |

(Continued)

OTHER PUBLICATIONS

H. Mulaosmanovic et al. "Novel ferroelectric FET based synapse for neuromorphic systems" Symposium on VLSI Technology Digest of Technical Papers, 2017, pp. 176-177.

(Continued)

*Primary Examiner* — Sheikh Maruf
(74) *Attorney, Agent, or Firm* — Harness, Dickey & Pierce, P.L.C.

(57) ABSTRACT

An oxide semiconductor transistor includes: an insulating substrate including a trench; a gate electrode in the trench; an oxide semiconductor layer on a surface of the insulating substrate, the surface exposed through the trench; and a ferroelectric layer between the gate electrode and the oxide semiconductor layer, wherein the oxide semiconductor layer may include a source region and a drain region which are on the insulating substrate outside the trench and are apart from each other with the gate electrode therebetween.

34 Claims, 18 Drawing Sheets

(56) References Cited

U.S. PATENT DOCUMENTS

| | | |
|---|---|---|
| 10,453,514 B2 | 10/2019 | Yoo |
| 2005/0199960 A1 | 9/2005 | Hoffman et al. |
| 2007/0126042 A1* | 6/2007 | Kijima .............. H01L 27/11502 257/295 |
| 2007/0194379 A1 | 8/2007 | Hosono et al. |
| 2008/0296674 A1 | 12/2008 | Graham et al. |
| 2014/0103414 A1* | 4/2014 | Koldiaev ............ H01L 27/0886 257/296 |
| 2015/0340372 A1* | 11/2015 | Pandey ............... H01L 29/6684 257/295 |
| 2015/0380511 A1* | 12/2015 | Irsigler ............. H01L 29/78391 257/295 |
| 2016/0035856 A1* | 2/2016 | van Bentum ......... H01L 29/516 257/295 |
| 2016/0056301 A1* | 2/2016 | Lee ................... H01L 29/42352 257/295 |
| 2016/0111549 A1* | 4/2016 | Baars .............. H01L 21/823462 257/295 |
| 2016/0172396 A1* | 6/2016 | Masuda ............ H01L 27/14658 257/295 |
| 2017/0309488 A1* | 10/2017 | Sakai ..................... G11C 11/223 |
| 2017/0345831 A1* | 11/2017 | Chavan .................. H01L 28/60 |
| 2017/0358684 A1* | 12/2017 | Chen ................. H01L 29/40111 |
| 2017/0365719 A1* | 12/2017 | Chen ................. H01L 29/40111 |
| 2018/0151746 A1* | 5/2018 | Tu ....................... H01L 29/513 |
| 2018/0166453 A1* | 6/2018 | Müller .................... H01L 28/60 |
| 2018/0166582 A1* | 6/2018 | Liao ....................... H10B 51/30 |
| 2018/0190338 A1* | 7/2018 | Li ......................... H01L 29/495 |
| 2018/0240803 A1* | 8/2018 | Yoo ....................... H01L 29/517 |
| 2018/0277191 A1* | 9/2018 | Yoo ....................... H01L 27/1159 |
| 2018/0277212 A1* | 9/2018 | Kim ................. H01L 29/40111 |
| 2018/0323313 A1 | 11/2018 | Hosono et al. |
| 2019/0019800 A1* | 1/2019 | Yoo ....................... H01L 29/513 |
| 2019/0348539 A1* | 11/2019 | Yoo .................. H01L 29/78391 |
| 2021/0151604 A1* | 5/2021 | Okada ............... H01L 29/78693 |

FOREIGN PATENT DOCUMENTS

| | | |
|---|---|---|
| KR | 100328126 B1 | 8/2002 |
| KR | 10-2013-0011942 A | 1/2013 |
| WO | WO-2020/031488 A1 | 2/2020 |

OTHER PUBLICATIONS

Extended European Search Report dated Oct. 14, 2021 in European Patent Application No. 21174314.1.

* cited by examiner

OXIDE SEMICONDUCTOR TRANSISTOR

CROSS-REFERENCE TO RELATED APPLICATION

This application claims the benefit of Korean Patent Application No. 10-2020-0059968, filed on May 19, 2020, in the Korean Intellectual Property Office, the disclosure of which is incorporated herein in its entirety by reference.

BACKGROUND

1. Field

The present disclosure relates to an oxide semiconductor transistor.

2. Description of Related Art

Oxide semiconductor devices have been studied for many years as a transparent semiconductor material having a wide bandgap within the range of 3.0 eV or greater. Oxide semiconductor devices have been mass-produced as driving devices for large-area organic light-emitting diode (OLED) TVs.

As the degree of integration of semiconductor devices increases, smaller semiconductor devices are required. In the case of oxide semiconductor transistors, a decrease in size may result in a decrease in channel length. This may lower the charge mobility of oxide semiconductor transistors and result in short channel effects causing a threshold voltage shift. In the case of ferroelectric field-effect transistors (FeFETs), the number of domains in a ferroelectric reduces because of a gate size decrease, and thus the number of bits that may be stored is reduced.

SUMMARY

Provided are oxide semiconductor transistors having improved electrical characteristics.

However, the present disclosure is not limited thereto.

Additional aspects will be set forth in part in the description which follows and, in part, will be apparent from the description, or may be learned by practice of the presented example embodiments of the disclosure.

According to an aspect of example embodiments, an oxide semiconductor transistor includes: an insulating substrate including a trench; a gate electrode in the trench; an oxide semiconductor layer on a surface of the insulating substrate, the surface exposed through the trench; and a ferroelectric layer between the gate electrode and the oxide semiconductor layer, wherein the oxide semiconductor layer includes a source region and a drain region on the insulating substrate outside the trench and apart from each other with the gate electrode therebetween.

The ferroelectric layer may extend along both lateral surfaces and a bottom surface of the gate electrode.

The ferroelectric layer may further extend onto a top surface of the gate electrode.

The ferroelectric layer may completely cover the top surface of the gate electrode.

The ferroelectric layer may extend along the oxide semiconductor layer outside the trench and exposes the source region and the drain region.

The oxide semiconductor transistor may further include a dielectric layer between the oxide semiconductor layer and the ferroelectric layer, wherein the ferroelectric layer and the dielectric layer may have negative capacitance characteristics.

The ferroelectric layer and the dielectric layer may extend along the oxide semiconductor layer outside of trench and exposes the source region and the drain region.

The oxide semiconductor transistor may further include a first diffusion barrier between the oxide semiconductor layer and the insulating substrate, wherein the first diffusion barrier may prevent, for example, reduce or prevent hydrogen from permeating into the oxide semiconductor layer.

The first diffusion barrier may extend between the insulating substrate and the source region and between the insulating substrate and the drain region.

The oxide semiconductor transistor may further include a second diffusion barrier between the oxide semiconductor layer and the ferroelectric layer, wherein the second diffusion barrier may prevent, for example, reduce or prevent hydrogen from permeating into the oxide semiconductor layer.

The second diffusion barrier may extend along the oxide semiconductor layer outside the trench and exposes the source region and the drain region.

The oxide semiconductor transistor may further include: an additional gate electrode on a side of the oxide semiconductor layer, the side opposite the gate electrode; and an additional gate insulating layer between the additional gate electrode and the oxide semiconductor layer.

The additional gate electrode and the additional gate insulating layer may be along a bottom surface of the gate electrode.

The additional gate electrode and the additional gate insulating layer may extend along both lateral surfaces of the gate electrode.

The additional gate electrode and the additional gate insulating layer may separate the oxide semiconductor layer from the surface of the insulating substrate exposed through the trench.

The oxide semiconductor transistor may further include: a source electrode on the source region; and a drain electrode on the drain region, wherein the source electrode and the drain electrode may be electrically connected to the source region and the drain region, respectively.

The ferroelectric layer may extend along the oxide semiconductor layer outside the trench, and the source electrode and the drain electrode may penetrate the ferroelectric layer and may make direct contact with the source region and the drain region, respectively.

According to an aspect of example embodiments, an oxide semiconductor transistor includes: an insulating substrate; a gate electrode on the insulating substrate; an oxide semiconductor layer on the insulating substrate to cover the gate electrode; and a gate insulating layer between the gate electrode and the oxide semiconductor layer, wherein the oxide semiconductor layer includes a source region and a drain region apart from each other with the gate electrode therebetween.

The oxide semiconductor layer and the gate insulating layer may extend along both lateral surfaces and a top surface of the gate electrode.

The oxide semiconductor layer may be separated from the insulating substrate by the gate insulating layer.

The gate insulating layer may overlap the source region and the drain region in a direction perpendicular to a top surface of the insulating substrate.

The oxide semiconductor transistor may further include a dielectric layer between the oxide semiconductor layer and the gate insulating layer, wherein the gate insulating layer may include a ferroelectric material.

The oxide semiconductor transistor may further include a first diffusion barrier between the oxide semiconductor layer and the gate insulating layer, wherein the first diffusion barrier may prevent, for example, reduce or prevent hydrogen from permeating into the oxide semiconductor layer.

The oxide semiconductor transistor may further include a second diffusion barrier on the oxide semiconductor layer, wherein the second diffusion barrier may prevent, for example, reduce or prevent hydrogen from permeating into the oxide semiconductor layer.

The second diffusion barrier may extend along the oxide semiconductor layer and exposes the source region and the drain region.

The gate insulating layer may include a pair of end surfaces opposite each other in an extending direction of the gate insulating layer, and the pair of end surfaces of the gate insulating layer may be in direct contact with a top surface of the insulating substrate.

The source region and the drain region may be in direct contact with the top surface of the insulating substrate.

The oxide semiconductor transistor may further include: a source electrode on the source region; and a drain electrode on the drain region, wherein the source electrode and the drain electrode may be electrically connected to the source region and the drain region, respectively.

The oxide semiconductor transistor may further include an upper insulating layer on the oxide semiconductor layer, wherein the source electrode and the drain electrode may penetrate the upper insulating layer and may be electrically connected to the source region and the drain region, respectively.

The oxide semiconductor transistor may further include: an additional gate electrode on a side of the oxide semiconductor layer, the side opposite the gate electrode; and an additional gate insulating layer between the additional gate electrode and the oxide semiconductor layer.

The additional gate electrode and the additional gate insulating layer may be along a top surface of the gate electrode.

The additional gate electrode and the additional gate insulating layer may be along both lateral surfaces and a top surface of the gate electrode.

The additional gate insulating layer may extend along the oxide semiconductor layer and exposes the source region and the drain region.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
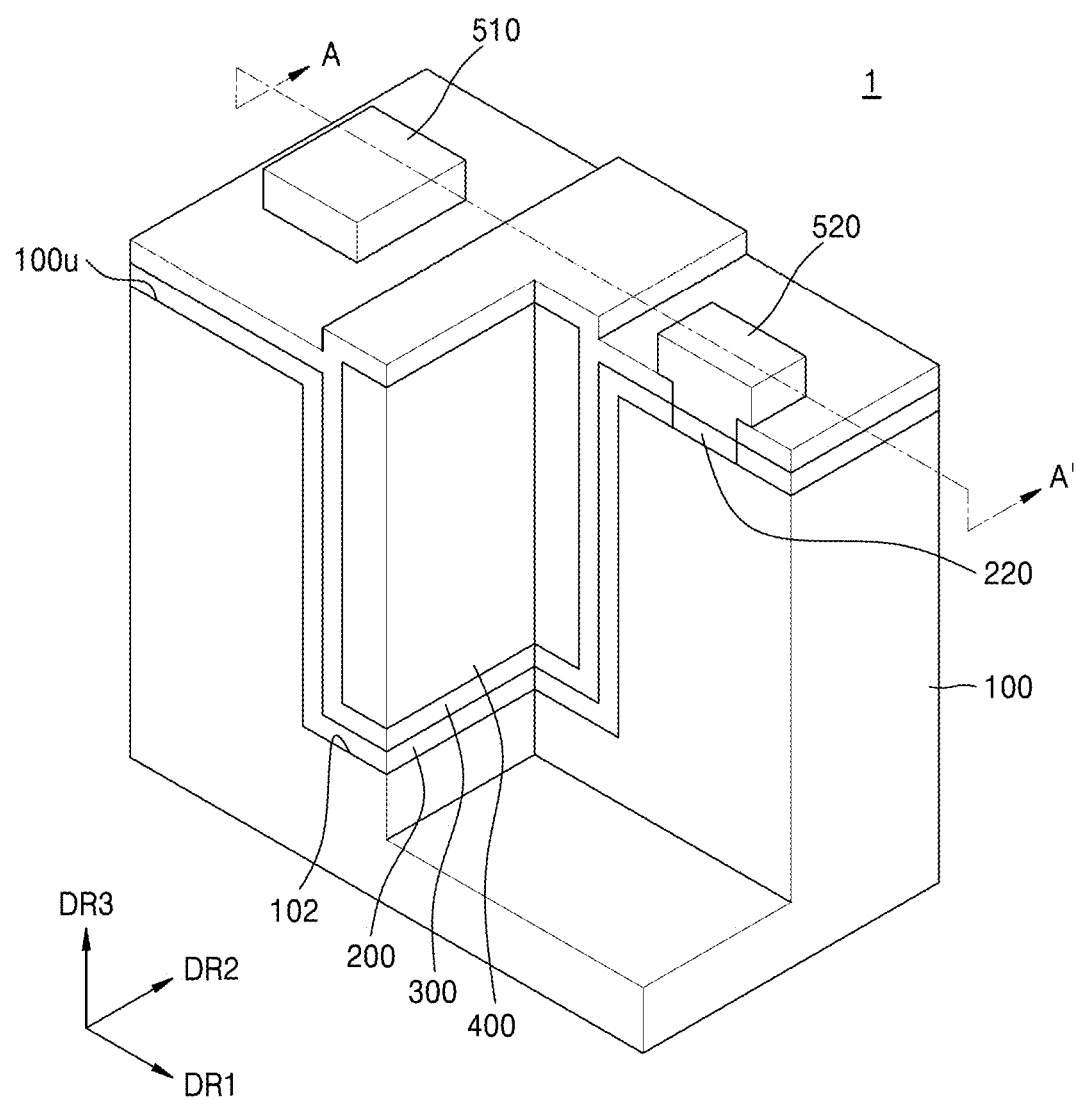
FIG. 1 is a perspective view of an oxide semiconductor transistor according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the drawings, like reference numerals refer to like elements, and the sizes of elements may be exaggerated for clarity and convenience of illustration. The example embodiments described herein are for illustrative purposes only, and various modifications may be made therein.

In the following description, when an element is referred to as being "above" or "on" another element, it may be directly on the other element while making contact with the other element or may be above the other element without making contact with the other element.

The terms of a singular form may include plural forms unless otherwise mentioned. It will be further understood that the terms "comprises" and/or "comprising" used herein specify the presence of stated features or elements, but do not preclude the presence or addition of one or more other features or elements.

Figure 2:
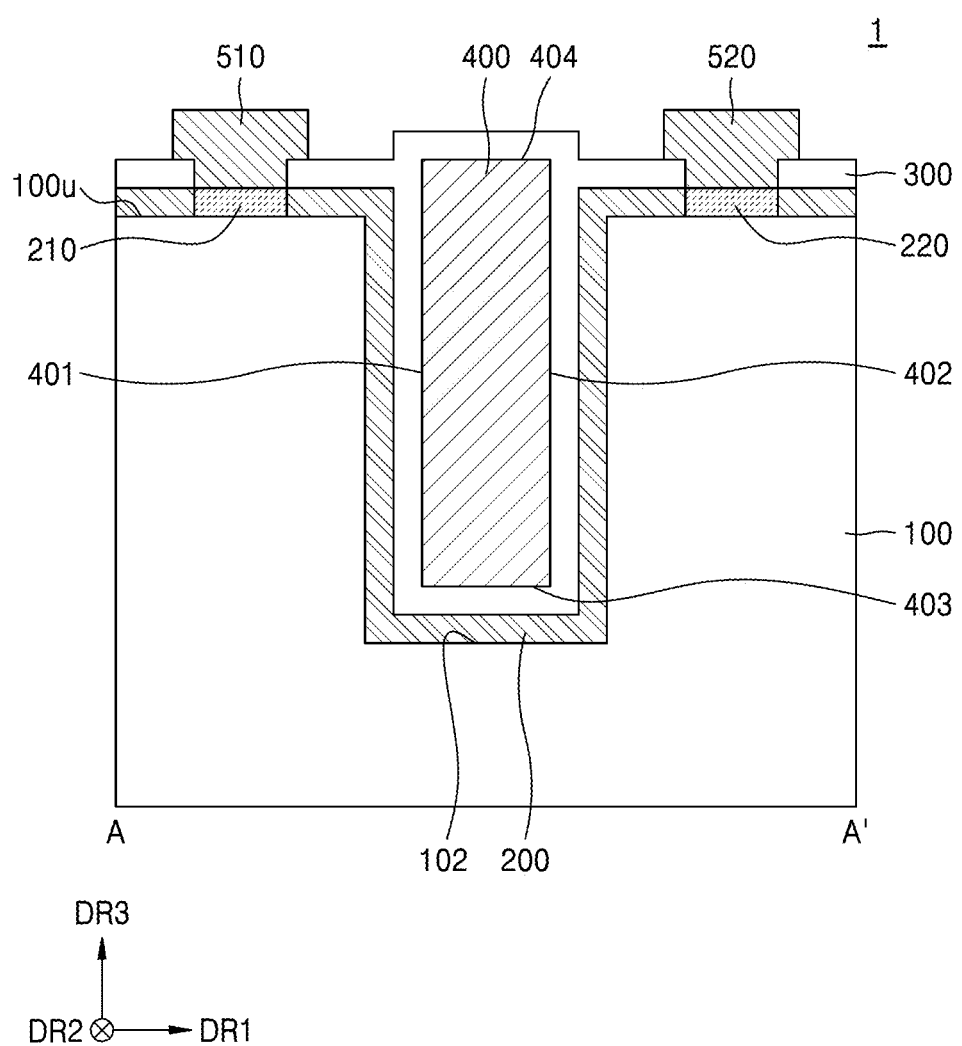
FIG. 2 is a cross-sectional view taken along line A-A' in FIG. 1.

FIG. 1 is a perspective view of an oxide semiconductor transistor 1 according to example embodiments. FIG. 2 is a cross-sectional view taken along line A-A' in FIG. 1.

Referring to FIGS. 1 and 2, the oxide semiconductor transistor 1 may be provided as follows. The oxide semiconductor transistor 1 may include an insulating substrate 100, an oxide semiconductor layer 200, a gate insulating layer 300, a gate electrode 400, a source electrode 510, and/or a drain electrode 520. The insulating substrate 100 may include an electrically insulating material. For example, the insulating substrate 100 may include a silicon oxide, a silicon nitride, or a silicon oxynitride.

The insulating substrate 100 may include a trench 102. The trench 102 may be a region formed by recessing a top surface 100u of the insulating substrate 100. The trench 102 may have a width in a first direction DR1 parallel to the top surface 100u of the insulating substrate 100. The trench 102 may extend in a second direction DR2 that crosses the first direction DR1 and is parallel to the top surface 100u of the insulating substrate 100.

The oxide semiconductor layer 200 may be provided on the insulating substrate 100. The oxide semiconductor layer 200 may be provided on a surface of the insulating substrate 100 which is exposed through the trench 102 and on the top surface 100u of the insulating substrate 100. The oxide semiconductor layer 200 may extend along the surface of the insulating substrate 100 exposed through the trench 102 and the top surface 100u of the insulating substrate 100. For example, the oxide semiconductor layer 200 may conformally extend. The thickness of the oxide semiconductor layer 200 may be determined as needed. The oxide semiconductor layer 200 may include an oxide semiconductor. For example, the oxide semiconductor layer 200 may include an oxide of a material selected from Group 12, 13, and 14 metal elements such as zinc (Zn), indium (In), gallium (Ga), tin (Sn), cadmium (Cd), germanium (Ge), hafnium (Hf), or a combination thereof. For example, the oxide semiconductor layer 200 may include a Zn oxide-based material such as an Zn oxide, an In—Zn oxide, or a Ga—In—Zn oxide, or the like. For example, the oxide semiconductor layer 200 may include an In—Ga—Zn—O (IGZO) semiconductor in which metals such as indium (In) and gallium (Ga) are contained in ZnO. The oxide semiconductor layer 200 may provide a region in which a channel of the oxide semiconductor transistor 1 is formed.

The oxide semiconductor layer 200 may include a source region 210 and a drain region 220. The source region 210 and the drain region 220 may be apart from each other in the first direction DR1 with the trench 102 therebetween. The source region 210 and the drain region 220 may be formed by implanting an n-type or p-type dopant into the oxide semiconductor layer 200 provided on the top surface 100u of the insulating substrate 100. The source region 210 and the drain region 220 may have a conductivity type. For example, the source region 210 and the drain region 220 may have an n-type conductivity. The source region 210 and the drain region 220 may be in direct contact with the top surface 100u of the insulating substrate 100.

The gate electrode 400 may be provided in the trench 102. The gate electrode 400 may extend in a third direction DR3 perpendicular to the top surface 100u of the insulating substrate 100. The gate electrode 400 may protrude to the outside of the trench 102. A top surface 404 of the gate electrode 400 may be higher than the top surface 100u of the insulating substrate 100. The gate electrode 400 may extend in the second direction DR2. A first lateral surface 401, a second lateral surface 402, and a bottom surface 403 of the gate electrode 400 may face the oxide semiconductor layer 200. The gate electrode 400 may be electrically disconnected from the oxide semiconductor layer 200. The gate electrode 400 may be apart from the oxide semiconductor layer 200. The gate electrode 400 may include an electrically conductive material. For example, the gate electrode 400 may include a metal or a metal compound.

In the trench 102, the gate insulating layer 300 may be between the gate electrode 400 and the oxide semiconductor layer 200. Outside the trench 102, the gate insulating layer 300 may be provided on the oxide semiconductor layer 200 and the gate electrode 400. The gate insulating layer 300 may surround the top surface 404, the first lateral surface 401, the second lateral surface 402, and the bottom surface 403 of the gate electrode 400. The gate insulating layer 300 may extend along a top surface of the oxide semiconductor layer 200. In the following description, the top surface of the oxide semiconductor layer 200 may refer to a surface of the oxide semiconductor layer 200 which is opposite a surface of the oxide semiconductor layer 200 facing the insulating substrate 100. In the following description, the surface of the oxide semiconductor layer 200 facing the insulating substrate 100 may be referred to as a bottom surface of the oxide semiconductor layer 200. The gate insulating layer 300 may expose the source region 210 and the drain region 220. In other words, the gate insulating layer 300 may include openings through which the source region 210 and the drain region 220 are respectively exposed. The gate insulating layer 300 may separate the gate electrode 400 and the oxide semiconductor layer 200 from each other. The gate insulating layer 300 may electrically disconnect the gate electrode 400 and the oxide semiconductor layer 200 from each other. The thickness of the gate insulating layer 300 may be determined as needed.

In an example, the gate insulating layer 300 may include a ferroelectric material. The ferroelectric material refers to a nonconductor or dielectric exhibiting a spontaneous polarization and is distinguished from multiferroic materials exhibiting two or more ferroic properties such as ferroelectricity, ferroelasticity, ferromagnetism, antiferromagnetism, and the like. For example, the ferroelectric material may include at least one selected from the group consisting of an oxide ferroelectric material, a polymer ferroelectric material, a fluoride ferroelectric material such as (BMF) $BaMgF_4$, and a ferroelectric material semiconductor. Examples of the oxide ferroelectric material may include: Perovskite ferroelectrics such as (PZT) $PbZr_xTi_{1-x}O_3$, $BaTiO_3$, and $PbTiO_3$; pseudo-ilmenite ferroelectrics such as $LiNbO_3$ and $LiTaO_3$; tungsten-bronze (TB) ferroelectrics such as $PbNb_3O_6$ and $Ba_2NaNb_5O_{15}$; bismuth layer-structured ferroelectrics such as SBT ($SrBi_2Ta_2O_9$), BLT (($Bi$, $La)_4Ti_3O_{12}$), and $Bi_4Ti_3O_{12}$; pyrochlore ferroelectrics such as $La_2Ti_2O_7$; solid solutions of these ferroelectrics; $RMnO_3$ including a rare earth element (R) such as yttrium (Y), erbium (Er), holmium (Ho), thulium (Tm), ytterbium (Yb), and lutetium (Lu); PGO ($Pb_5Ge_3O_{11}$). For example, the polymer ferroelectric material may include at least one selected from the group consisting of polyvinylidene fluoride (PVDF), a PVDF-containing polymer, a PVDF-containing copolymer, a PVDF-containing terpolymer, cyanopolymer, and a polymer and/or copolymer thereof. Examples of the ferroelectric material semiconductor may include Group 2-6 compounds such as CdZnTe, CdZnS, CdZnSe, CdMnS, CdFeS, CdMnSe, and CdFeSe. For example, the ferroelectric material may include HfO, $Hf_xZr_{1-x}O$, ZrO, or ferroelectrics having a fluorite structure and doped with silicon (Si), aluminum (Al), zirconium (Zr), yttrium (Y), lanthanum (La), gadolinium (Gd), strontium (Sr), or hafnium (Hf).

In an example, the gate insulating layer 300 may include a high-k dielectric material. The high-k dielectric material may refer to a material having a dielectric constant greater than that of a silicon oxide. For example, the gate insulating layer 300 may include $ZrO_2$, $HfO_2$, $La_2O_3$, $Ta_2O_5$, BaO, or $TiO_2$.

In an example, the gate insulating layer 300 may include a dielectric material that is not a high-k dielectric material. For example, the gate insulating layer 300 may include $SiO_2$, SiN, AlO, or a combination thereof.

The source electrode 510 and the drain electrode 520 may be provided on the source region 210 and the drain region 220, respectively. The source electrode 510 and the drain electrode 520 may be electrically connected to the source region 210 and the drain region 220, respectively. The source electrode 510 and the drain electrode 520 may penetrate the gate insulating layer 300 and may make direct contact with the source region 210 and the drain region 220, respectively. The source electrode 510 and the drain electrode 520 may include an electrically conductive material. For example, the source electrode 510 and the drain electrode 520 may include a metal or a metal compound.

The channel length of the oxide semiconductor transistor 1 may be the same or substantially the same as the length of the oxide semiconductor layer 200 between the source region 210 and the drain region 220. When the gate electrode 400 is arranged on the top surface 100u of the insulating substrate 100 without the trench 102, the channel length may be the same or substantially the same as the distance between the source region 210 and the drain region 220 the first direction DR1. Since the oxide semiconductor layer 200 of the present example embodiments extends along the surface of the insulating substrate 100 which is exposed through the trench 102, the channel length may be greater than the distance between the source region 210 and the drain region 220 in the first direction DR1. The oxide semiconductor transistor 1 of the present example embodiments may have a large channel length. Therefore, the oxide semiconductor transistor 1 may have improved electrical characteristics.

Figure 3:
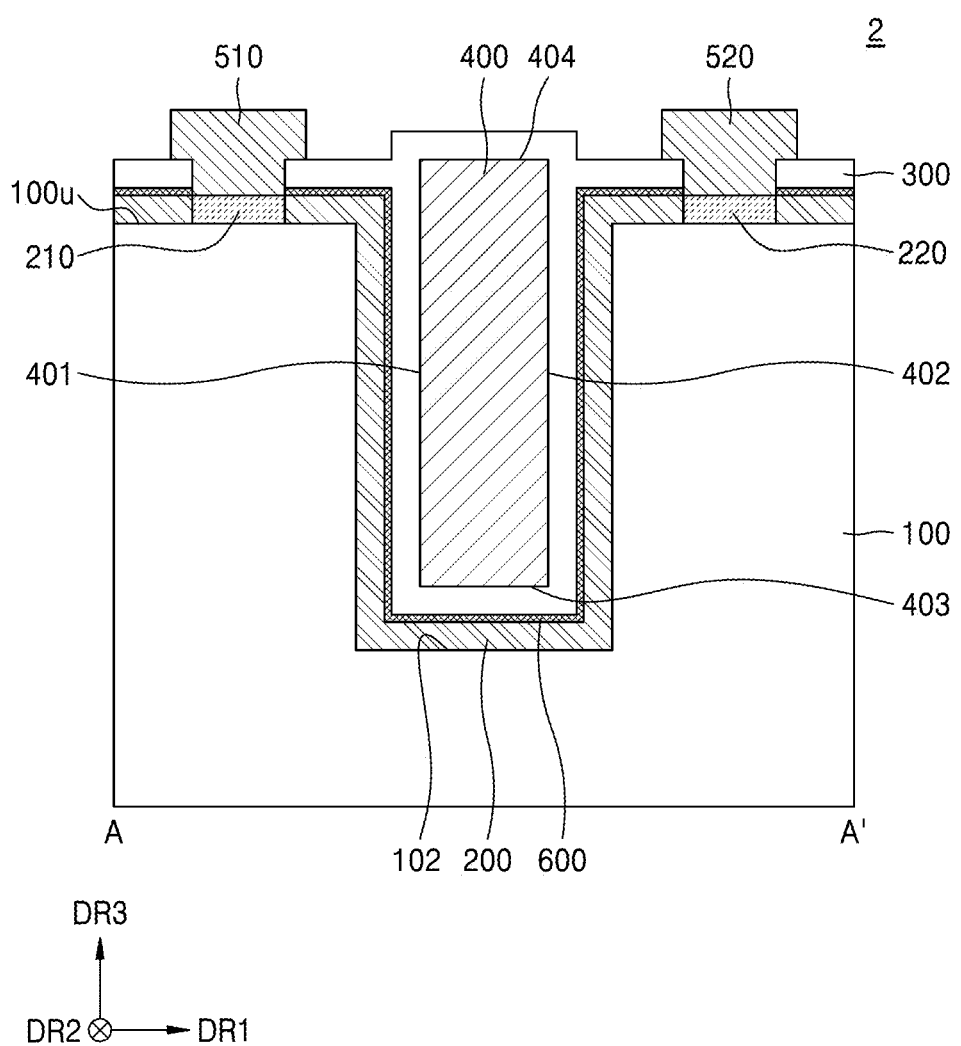
FIG. 3 is a cross-sectional view illustrating an oxide semiconductor transistor according to example embodiments, the cross-sectional view corresponding to line A-A' of FIG. 1.

FIG. 3 is a cross-sectional view illustrating an oxide semiconductor transistor 2 according to example embodiments, the cross-sectional view corresponding to line A-A' of FIG. 1. For clarity of illustration, the same or substantially the same structures as those described with reference to FIGS. 1 and 2 may not be described here.

Referring to FIG. 3, the oxide semiconductor transistor 2 may be provided as follows. The oxide semiconductor transistor 2 may include an insulating substrate 100, an oxide semiconductor layer 200, a dielectric layer 600, a gate insulating layer 300, a gate electrode 400, a source electrode 510, and/or a drain electrode 520. The insulating substrate 100, the oxide semiconductor layer 200, the gate electrode 400, the source electrode 510, and the drain electrode 520 may be the same or substantially the same as the insulating substrate 100, the oxide semiconductor layer 200, the gate electrode 400, the source electrode 510, and the drain electrode 520 which are described with reference to FIGS. 1 and 2.

Unlike in the description given with reference to FIGS. 1 and 2, the gate insulating layer 300 may be a ferroelectric layer. In other words, the gate insulating layer 300 may not include a dielectric material or a high-k dielectric material.

The dielectric layer 600 may be provided between the oxide semiconductor layer 200 and the gate insulating layer 300. The dielectric layer 600 may extend along a top surface of the oxide semiconductor layer 200. The dielectric layer 600 may expose the source region 210 and the drain region 220. The source electrode 510 and the drain electrode 520 may penetrate the dielectric layer 600 and may make direct contact with the source region 210 and the drain region 220, respectively. The thickness of the dielectric layer 600 may be determined as needed. The dielectric layer 600 may include a material for obtaining a desired capacitance. As a material included in the dielectric layer 600, a dielectric having a high dielectric constant may be used to cope with high-degree integration of integrated circuit devices. The dielectric layer 600 may include a material having a high dielectric constant. The high dielectric constant may refer to a dielectric constant greater than the electric constant of a silicon oxide. In example embodiments, the dielectric layer 600 may include a metal oxide containing at least one metal selected from the group consisting of calcium (Ca), strontium (Sr), barium (Ba), scandium (Sc), yttrium (Y), lanthanum (La), titanium (Ti), hafnium (Hf), zirconium (Zr), niobium (Nb), tantalum (Ta), cerium (Ce), praseodymium (Pr), neodymium (Nd), gadolinium (Gd), dysprosium (Dy), ytterbium (Yb), and lutetium (Lu). For example, the dielectric layer 600 may include $HfO_2$, $ZrO_2$, $CeO_2$, $La_2O_3$, $Ta_2O_3$, or $TiO_2$.

The gate insulating layer 300 (that is, a ferroelectric layer) may have negative capacitance characteristics owing to the dielectric layer 600. According to the present example embodiments, the oxide semiconductor transistor 2 may have a large channel length and may use negative capacitance characteristics. Therefore, the oxide semiconductor transistor 2 may have improved electrical characteristics.

Figure 4:
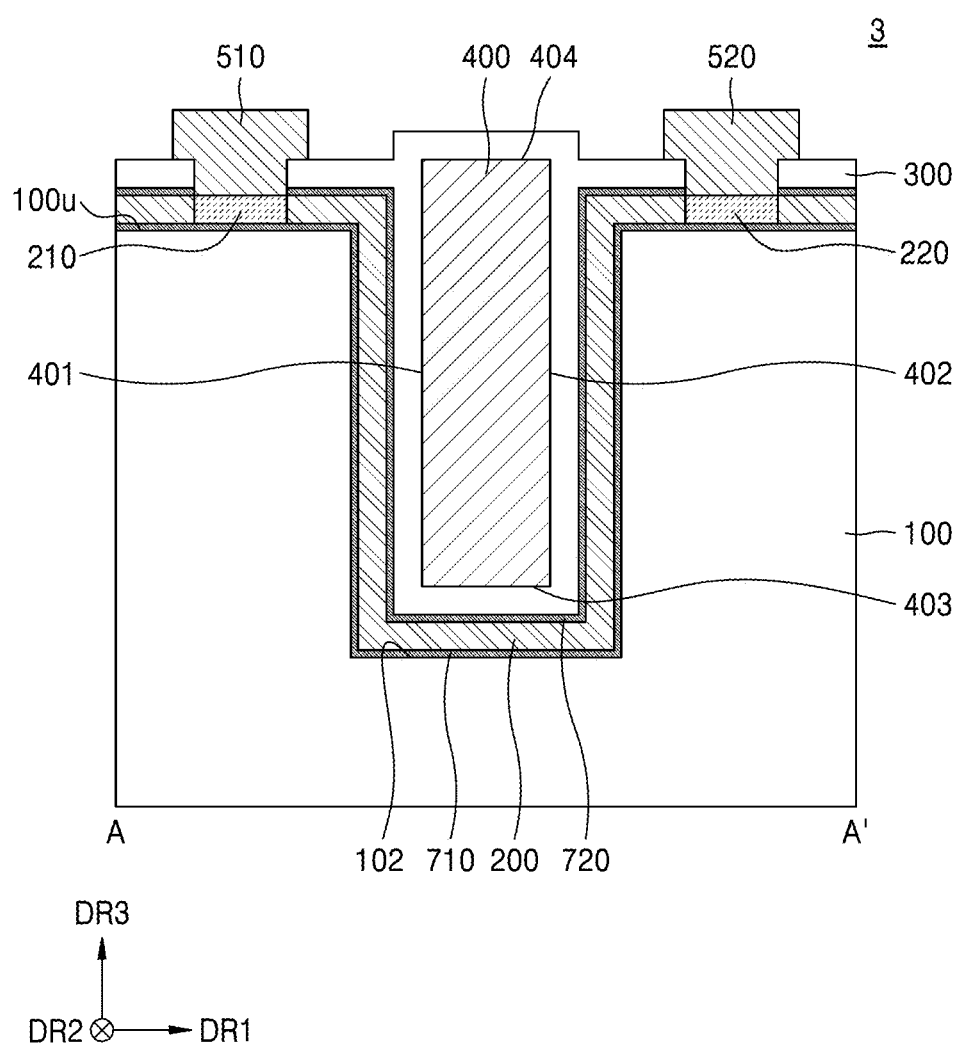
FIG. 4 is a cross-sectional view illustrating an oxide semiconductor transistor according to example embodiments, the cross-sectional view corresponding to line A-A' of FIG. 1.

FIG. 4 is a cross-sectional view illustrating an oxide semiconductor transistor 3 according to example embodiments, the cross-sectional view corresponding to line A-A' of FIG. 1. For clarity of illustration, the same or substantially the same structures as those described with reference to FIGS. 1 and 2 may not be described here.

Referring to FIG. 4, the oxide semiconductor transistor 3 may be provided as follows. The oxide semiconductor transistor 3 may include an insulating substrate 100, a lower diffusion barrier 710, an oxide semiconductor layer 200, an upper diffusion barrier 720, a gate insulating layer 300, a gate electrode 400, and a source electrode 510, and/or a drain electrode 520. The insulating substrate 100, the oxide semiconductor layer 200, the gate electrode 400, the source electrode 510, and the drain electrode 520 may be the same or substantially the same as the insulating substrate 100, the oxide semiconductor layer 200, the gate electrode 400, the source electrode 510, and the drain electrode 520 which are described with reference to FIGS. 1 and 2.

The lower diffusion barrier 710 may be provided between the insulating substrate 100 and the oxide semiconductor layer 200. The lower diffusion barrier 710 may extend along a bottom surface of the oxide semiconductor layer 200. The lower diffusion barrier 710 may extend between a source region 210 and the insulating substrate 100. The lower diffusion barrier 710 may separate the source region 210 and the insulating substrate 100 from each other. The lower diffusion barrier 710 may be in direct contact with the source region 210. The lower diffusion barrier 710 may extend between a drain region 220 and the insulating substrate 100. The lower diffusion barrier 710 may separate the drain region 220 and the insulating substrate 100 from each other. The lower diffusion barrier 710 may be in direct contact with the drain region 220. The lower diffusion barrier 710 may prevent, for example, reduce or prevent hydrogen from permeating into a lower portion of the oxide semiconductor layer 200. For example, the lower diffusion barrier 710 may include $Al_2O_3$, SiN, SiON, or a combination thereof. The thickness of the lower diffusion barrier 710 may be determined as needed.

The upper diffusion barrier 720 may be provided between the oxide semiconductor layer 200 and the gate insulating layer 300. The upper diffusion barrier 720 may extend along a top surface of the oxide semiconductor layer 200. The upper diffusion barrier 720 may expose the source region 210 and the drain region 220. The source electrode 510 and the drain electrode 520 may penetrate the upper diffusion barrier 720 and may make direct contact with the source region 210 and the drain region 220 respectively. The upper diffusion barrier 720 may prevent, for example, reduce or prevent hydrogen from permeating into an upper portion of the oxide semiconductor layer 200. For example, the upper diffusion barrier 720 may include $Al_2O_3$, SiN, SiON, or a combination thereof. The thickness of the upper diffusion barrier 720 may be determined as needed. In the present example embodiments, the lower diffusion barrier 710 and the upper diffusion barrier 720 may prevent, for example, reduce or prevent hydrogen from permeating into the oxide semiconductor layer 200, and the oxide semiconductor transistor 3 may have a large channel length. Therefore, the oxide semiconductor transistor 3 may have improved electrical characteristics.

Figure 5:
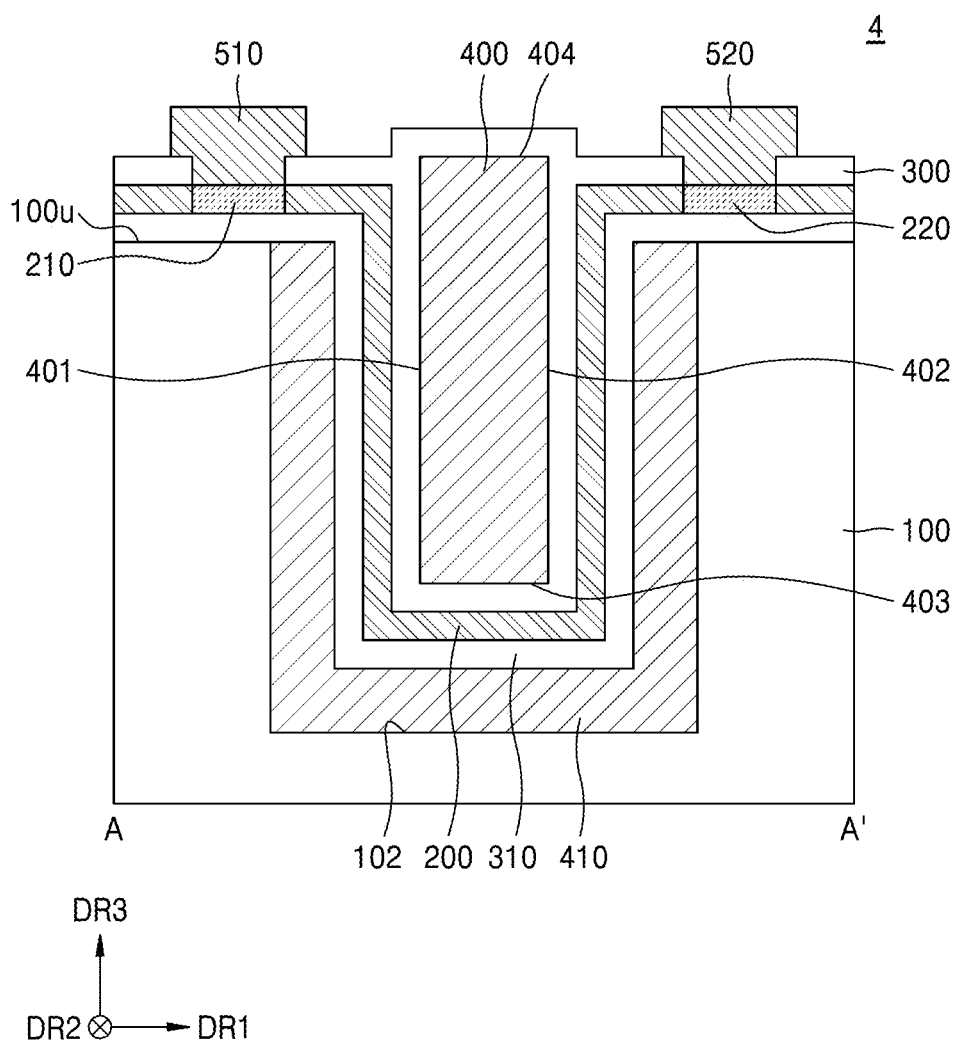
FIG. 5 is a cross-sectional view illustrating an oxide semiconductor transistor according to example embodiments, the cross-sectional view corresponding to line A-A' of FIG. 1.

FIG. 5 is a cross-sectional view illustrating an oxide semiconductor transistor 4 according to example embodiments, the cross-sectional view corresponding to line A-A' of FIG. 1. For clarity of illustration, the same or substantially the same structures as those described with reference to FIGS. 1 and 2 may not be described here.

Referring to FIG. 5, the oxide semiconductor transistor 4 may be provided as follows. The oxide semiconductor transistor 4 may include an insulating substrate 100, an oxide semiconductor layer 200, a gate insulating layer 300, a gate electrode 400, a source electrode 510, a drain electrode 520, a first additional gate electrode 410, and/or a first additional gate insulating layer 310.

The insulating substrate 100, the oxide semiconductor layer 200, the gate insulating layer 300, the gate electrode 400, the source electrode 510, and the drain electrode 520 may be the same or substantially the same as the insulating substrate 100, the oxide semiconductor layer 200, the gate insulating layer 300, the gate electrode 400, the source electrode 510, and the drain electrode 520 which are described with reference to FIGS. 1 and 2.

The first additional gate electrode 410 may be provided on a surface of the insulating substrate 100 which is exposed through a trench 102. The first additional gate electrode 410 may extend along the surface of the insulating substrate 100 which is exposed through the trench 102. End surfaces of the first additional gate electrode 410 which are opposite each other in the extending direction of the first additional gate electrode 410 may be coplanar with a top surface 100u of the insulating substrate 100. The end surfaces of the first additional gate electrode 410 which are opposite each other in the extending direction of the first additional gate electrode 410 may be located substantially at the same level as the top surface 100u of the insulating substrate 100. The first additional gate electrode 410 may be electrically disconnected from the oxide semiconductor layer 200. The first additional gate electrode 410 may be apart from the oxide semiconductor layer 200. The first additional gate electrode 410 may include an electrically conductive material. For example, the first additional gate electrode 410 may include a metal or a metal compound.

The first additional gate insulating layer 310 may be provided between the first additional gate electrode 410 and the oxide semiconductor layer 200 and between the insulating substrate 100 and the oxide semiconductor layer 200. The first additional gate insulating layer 310 may extend along a bottom surface of the oxide semiconductor layer 200. The first additional gate insulating layer 310 may electrically disconnect the first additional gate electrode 410 and the oxide semiconductor layer 200 from each other. The first additional gate insulating layer 310 may separate the first additional gate electrode 410 and the oxide semiconductor layer 200 from each other. The first additional gate insulating layer 310 may extend between a source region 210 and the insulating substrate 100 to separate the source region 210 and the insulating substrate 100 from each other. The first additional gate insulating layer 310 may extend between a drain region 220 and the insulating substrate 100 to separate the drain region 220 and the insulating substrate 100 from each other. The thickness of the first additional gate insulating layer 310 may be determined as needed. The first additional gate insulating layer 310 may include a ferroelectric material, a dielectric material, or a high-k dielectric material. The ferroelectric material, the dielectric material, and the high-k dielectric material may be the same or substantially the same as those described with reference to FIGS. 1 and 2. In an example, the first additional gate insulating layer 310 may have the same or substantially the same thickness and material as the gate insulating layer 300.

The gate electrode 400 and the first additional gate electrode 410 may be gate electrodes of a double gate structure. The oxide semiconductor transistor 4 of the present example embodiments may have a double gate structure and a large channel length. Therefore, the oxide semiconductor transistor 4 may have improved electrical characteristics.

Figure 6:
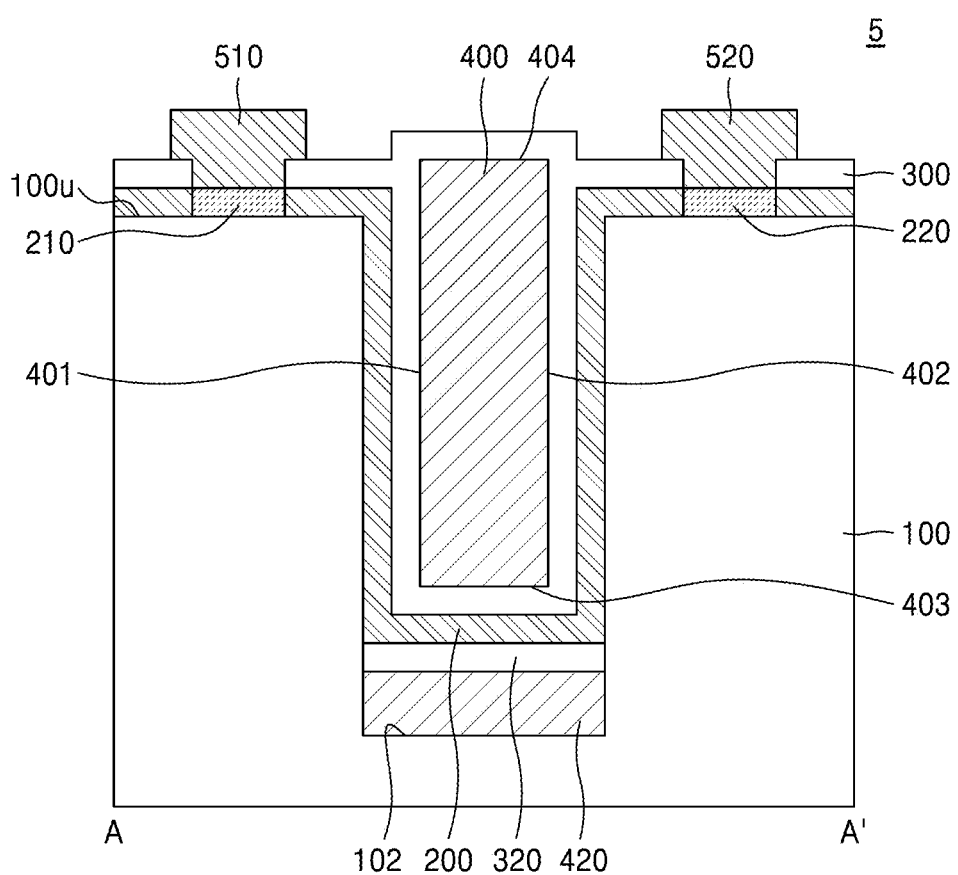
FIG. 6 is a cross-sectional view illustrating an oxide semiconductor transistor according to example embodiments, the cross-sectional view corresponding to line A-A' of FIG. 1.

FIG. 6 is a cross-sectional view illustrating an oxide semiconductor transistor 5 according to example embodiments, the cross-sectional view corresponding to line A-A' of FIG. 1. For clarity of illustration, the same or substantially the same structures as those described with reference to FIGS. 1 and 2 may not be described here.

Referring to FIG. 6, the oxide semiconductor transistor 5 may be provided as follows. The oxide semiconductor transistor 5 may include an insulating substrate 100, an oxide semiconductor layer 200, a gate insulating layer 300, a gate electrode 400, a source electrode 510, a drain electrode 520, a second additional gate insulating layer 320, and/or a second additional gate electrode 420.

The insulating substrate 100, the oxide semiconductor layer 200, the gate insulating layer 300, the gate electrode 400, the source electrode 510, and the drain electrode 520 may be the same or substantially the same as the insulating substrate 100, the oxide semiconductor layer 200, the gate insulating layer 300, the gate electrode 400, the source electrode 510, and the drain electrode 520 which are described with reference to FIGS. 1 and 2.

Unlike in the description given with reference to FIGS. 1 and 2, a lower portion of a trench 102 may not be filled with the oxide semiconductor layer 200, the gate insulating layer 300, and the gate electrode 400. The second additional gate electrode 420 and the second additional gate insulating layer 320 may be provided in the lower portion of the trench 102. The trench 102 may be completely filled with the second additional gate electrode 420, the second additional gate insulating layer 320, the oxide semiconductor layer 200, the gate insulating layer 300, and the gate electrode 400.

The second additional gate electrode 420 may be provided on a side of the oxide semiconductor layer 200 which is opposite the gate electrode 400. The second additional gate electrode 420 and the gate electrode 400 may be apart from each other in a third direction DR3. The second additional gate electrode 420 may include an electrically conductive material. For example, the second additional gate electrode 420 may include a metal or a metal compound.

The second additional gate insulating layer 320 may be provided between the second additional gate electrode 420 and the oxide semiconductor layer 200. The second additional gate insulating layer 320 may be arranged on a side of the oxide semiconductor layer 200 which is opposite the gate insulating layer 300. The second additional gate insulating layer 320 may electrically isolate the second additional gate electrode 420 and the oxide semiconductor layer 200 from each other. The second additional gate insulating layer 320 may separate the second additional gate electrode 420 and the oxide semiconductor layer 200 from each other. The second additional gate insulating layer 320 may include a ferroelectric material, a dielectric material, or a high-k dielectric material. The ferroelectric material, the dielectric material, and the high-k dielectric material may be the same or substantially the same as those described with reference to FIGS. 1 and 2. In an example, the second additional gate insulating layer 320 may have the same or substantially the same thickness and material as the gate insulating layer 300.

The gate electrode 400 and the second additional gate electrode 420 may be gate electrodes of a double gate structure. The oxide semiconductor transistor 5 of the present example embodiments may have a double gate structure and a large channel length. Therefore, the oxide semiconductor transistor 5 may have improved electrical characteristics.

Figure 7:
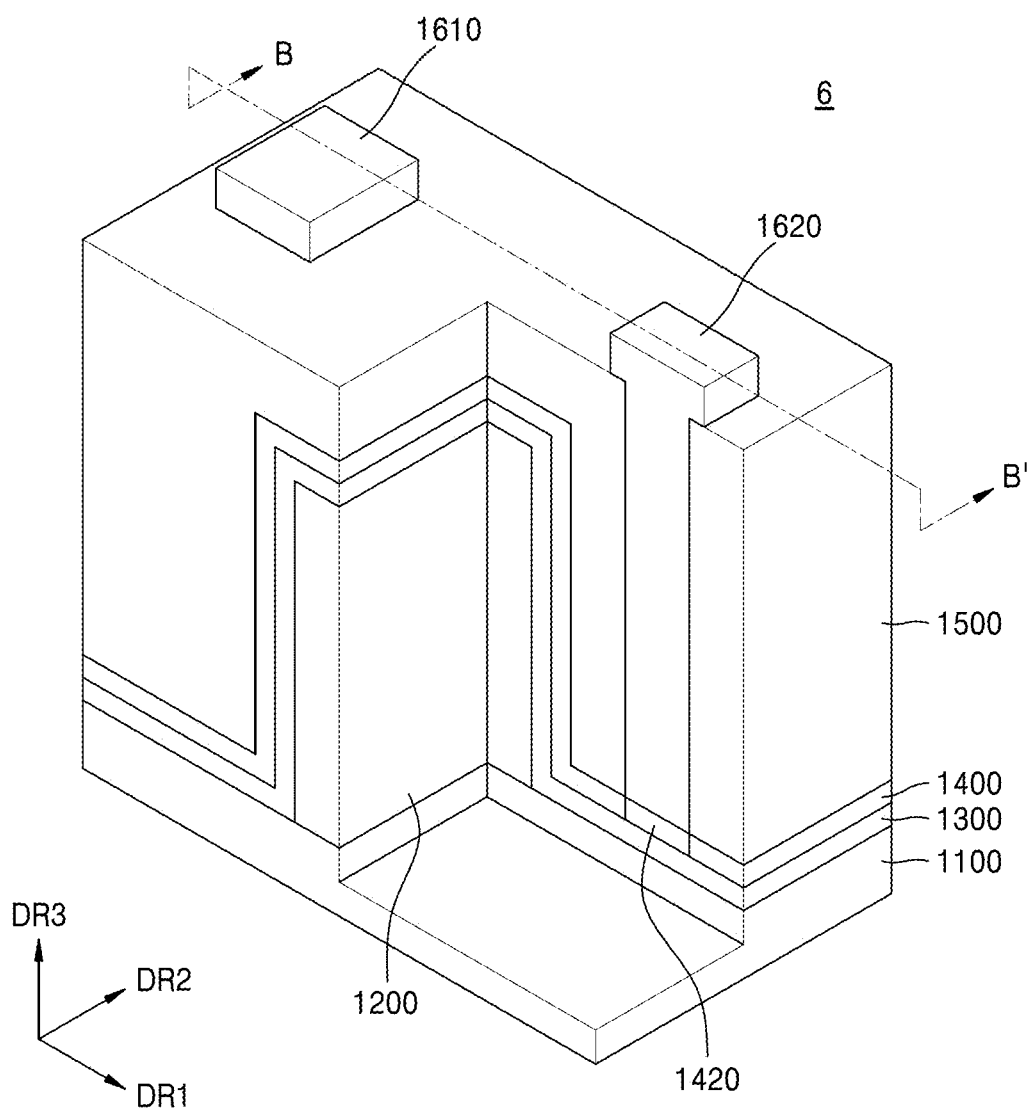
FIG. 7 is a perspective view of an oxide semiconductor transistor according to example embodiments.
Figure 8:
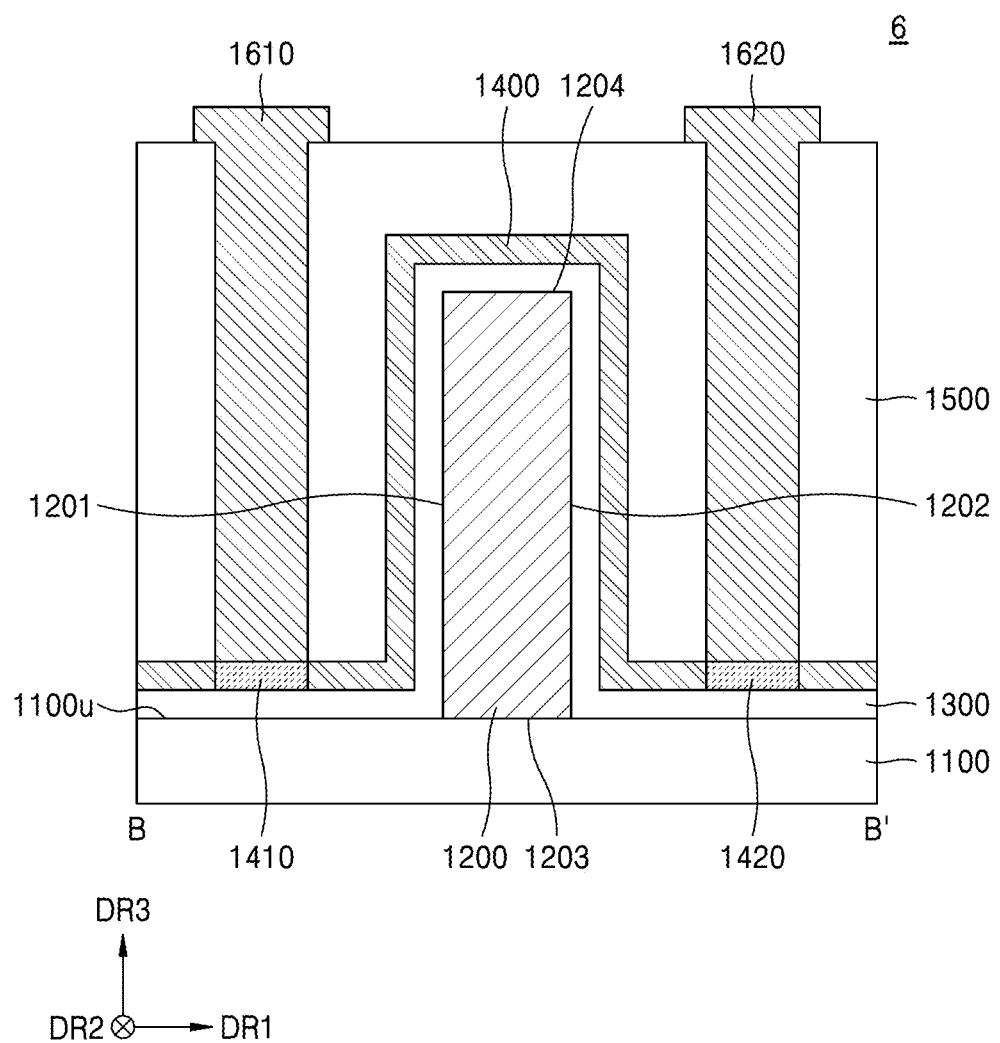
FIG. 8 is a cross-sectional view taken along line B-B' of FIG. 7.

FIG. 7 is a perspective view of an oxide semiconductor transistor 6 according to example embodiments. FIG. 8 is a cross-sectional view taken along line B-B' of FIG. 7. For clarity of illustration, the same or substantially the same structures as those described with reference to FIGS. 1 and 2 may not be described here.

Referring to FIGS. 7 and 8, the oxide semiconductor transistor 6 may be provided as follows. The oxide semiconductor transistor 6 may include an insulating substrate 1100, a gate electrode 1200, a gate insulating layer 1300, an oxide semiconductor layer 1400, a source electrode 1610, and/or a drain electrode 1620. The insulating substrate 1100 may include an electrically insulating material. For example, the insulating substrate 1100 may include a silicon oxide, a silicon nitride, or a silicon oxynitride.

The gate electrode 1200 may be provided on the insulating substrate 1100. A first lateral surface 1201, a second lateral surface 1202, and a top surface 1204 of the gate electrode 1200 may be exposed above the insulating substrate 1100. The first lateral surface 1201 and the second lateral surface 1202 of the gate electrode 1200 may be opposite each other in a first direction DR1. In an example, a bottom surface 1203 of the gate electrode 1200 may in direct contact with a top surface 1100u of the insulating substrate 1100. The gate electrode 1200 may include an electrically conductive material. For example, the gate electrode 1200 may include a metal or a metal compound.

The gate insulating layer 1300 may be provided on the insulating substrate 1100 and the gate electrode 1200. The gate insulating layer 1300 may cover the insulating substrate 1100 and the gate electrode 1200. The gate insulating layer 1300 may extend along the top surface 1100u of the insulating substrate 1100, and the first lateral surface 1201, the second lateral surface 1202, and the top surface 1204 of the gate electrode 1200. For example, the gate insulating layer 1300 may conformally extend along the top surface 1100u of the insulating substrate 1100, and the first lateral surface 1201, the second lateral surface 1202, and the top surface 1204 of the gate electrode 1200. The thickness of the gate insulating layer 1300 may be determined as needed. The gate insulating layer 1300 may include a ferroelectric material, a dielectric material, or a high-k dielectric material. The ferroelectric material, the dielectric material, and the high-k dielectric material may be the same or substantially the same as those described with reference to FIGS. 1 and 2.

The oxide semiconductor layer 1400 may be provided on the gate insulating layer 1300. The oxide semiconductor layer 1400 may extend along the gate insulating layer 1300. For example, the oxide semiconductor layer 1400 may conformally extend along a top surface of the gate insulating layer 1300. The top surface of the gate insulating layer 1300 may be opposite a bottom surface of the gate insulating layer 1300 which faces the insulating substrate 1100. The oxide semiconductor layer 1400 may be separated from the gate electrode 1200 and the insulating substrate 1100 owing to the gate insulating layer 1300. The oxide semiconductor layer 1400 may be electrically disconnected from the gate electrode 1200 owing to the gate insulating layer 1300. The thickness of the oxide semiconductor layer 1400 may be determined as needed. The oxide semiconductor layer 1400 may include an oxide semiconductor. The oxide semiconductor may be the same or substantially the same as that described with reference to FIGS. 1 and 2.

The oxide semiconductor layer 1400 may include a source region 1410 and a drain region 1420. The source region 1410 and the drain region 1420 may be apart from each other in the first direction DR1 with the gate electrode 1200 therebetween. The source region 1410 and the drain region 1420 may be formed by implanting an n-type or p-type dopant into the oxide semiconductor layer 1400 provided above the top surface 1100u of the insulating substrate 1100. The source region 1410 and the drain region 1420 may have a conductivity type. For example, the source region 1410 and the drain region 1420 may have an n-type conductivity. The source region 1410 and the drain region 1420 may be in direct contact with the top surface of the gate insulating layer 1300.

An upper insulating layer 1500 may be provided on the oxide semiconductor layer 1400. The upper insulating layer 1500 may cover the oxide semiconductor layer 1400. The upper insulating layer 1500 may include an electrically insulating material. For example, the upper insulating layer 1500 may include a silicon oxide, a silicon nitride, or a silicon oxynitride.

The source electrode 1610 and the drain electrode 1620 may be provided on the source region 1410 and the drain region 1420, respectively. The source electrode 1610 and the drain electrode 1620 may be electrically connected to the source region 1410 and the drain region 1420, respectively. The source electrode 1610 and the drain electrode 1620 may penetrate the upper insulating layer 1500 and may make direct contact with the source region 1410 and the drain region 1420, respectively. The source electrode 1610 and the drain electrode 1620 may include an electrically conductive material. For example, the source electrode 1610 and the drain electrode 1620 may include a metal or a metal compound.

The channel length of the oxide semiconductor transistor 6 may be the same or substantially the same as the length of the oxide semiconductor layer 1400 between the source region 1410 and the drain region 1420. When the oxide semiconductor layer 1400 is provided between the gate electrode 1200 and the insulating substrate 1100, the channel length of the oxide semiconductor transistor 6 depends on the distance between the source region 1410 and the drain region 1420 in the first direction DR1.

Since the oxide semiconductor layer 1400 of the present example embodiments extends along the first lateral surface 1201, the second lateral surface 1202, and the top surface 1204 of the gate electrode 1200, the channel length may be greater than the distance between the source region 1410 and the drain region 1420 in the first direction DR1. Therefore, the oxide semiconductor transistor 6 of the present example embodiments may have a large channel length. As a result, the oxide semiconductor transistor 6 may have improved electrical characteristics.

Figure 9:
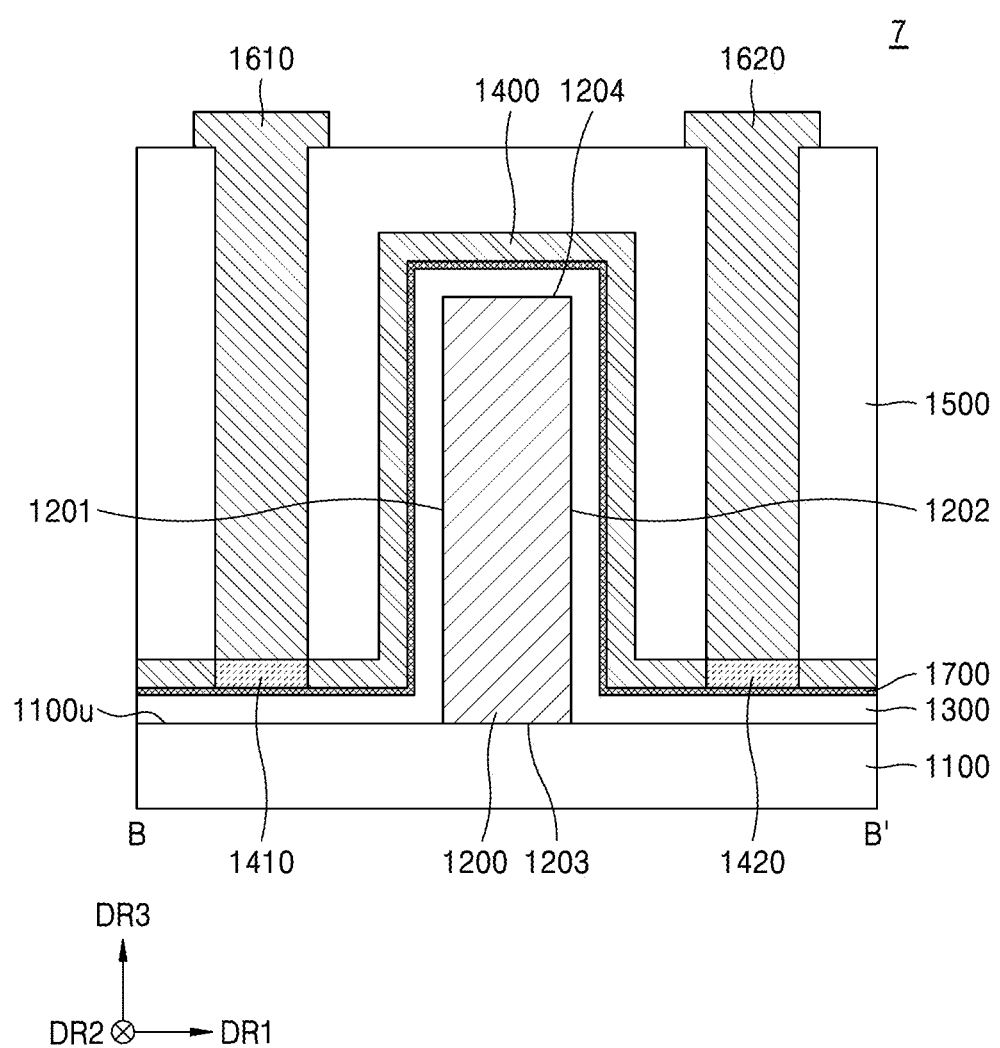
FIG. 9 is a cross-sectional view illustrating an oxide semiconductor transistor according to example embodiments, the cross-sectional view corresponding to line B-B' of FIG. 7.

FIG. 9 is a cross-sectional view illustrating an oxide semiconductor transistor 7 according to example embodiments, the cross-sectional view corresponding to line B-B' of FIG. 7. For clarity of illustration, the same or substantially the same structures as those described with reference to FIGS. 7 and 8 may not be described here.

Referring to FIG. 9, the oxide semiconductor transistor 7 may be provided as follows. The oxide semiconductor transistor 7 may include an insulating substrate 1100, a gate electrode 1200, a gate insulating layer 1300, a dielectric layer 1700, an oxide semiconductor layer 1400, a source electrode 1610, and/or a drain electrode 1620. The insulating substrate 1100, the gate electrode 1200, the oxide semiconductor layer 1400, the source electrode 1610, and the drain electrode 1620 may be the same or substantially the same as the insulating substrate 1100 and the gate electrode 1200, the oxide semiconductor layer 1400, the source electrode 1610, and the drain electrode 1620 which are described with reference to FIGS. 7 and 8.

Unlike in the description given with reference to FIGS. 7 and 8, the gate insulating layer 1300 may be a ferroelectric layer. In other words, the gate insulating layer 1300 may not include a dielectric material or a high-k dielectric material.

The dielectric layer 1700 may be provided between the gate insulating layer 1300 and the oxide semiconductor layer 1400. The dielectric layer 1700 may extend along a top surface of the gate insulating layer 1300. The dielectric layer 1700 may extend between a source region 1410 and the gate insulating layer 1300. The dielectric layer 1700 may separate the source region 1410 and the gate insulating layer 1300 from each other. The dielectric layer 1700 may be in direct contact with the source region 1410. The dielectric layer 1700 may extend between a drain region 1420 and the gate insulating layer 1300. The dielectric layer 1700 may separate the drain region 1420 and the gate insulating layer 1300 from each other. The dielectric layer 1700 may be in direct contact with the drain region 1420. The thickness of the dielectric layer 1700 may be determined as needed. The dielectric layer 1700 may include a material having a high dielectric constant. The high dielectric constant may refer to a dielectric constant greater than the electric constant of a silicon oxide. In some example embodiments, the dielectric layer 1700 may include a metal oxide containing at least one metal selected from the group consisting of calcium (Ca), strontium (Sr), barium (Ba), scandium (Sc), yttrium (Y), lanthanum (La), titanium (Ti), hafnium (Hf), zirconium (Zr), niobium (Nb), tantalum (Ta), cerium (Ce), praseodymium (Pr), neodymium (Nd), gadolinium (Gd), dysprosium (Dy), ytterbium (Yb), and lutetium (Lu). For example, the dielectric layer 1700 may include $HfO_2$, $ZrO_2$, $CeO_2$, $La_2O_3$, $Ta_2O_3$, or $TiO_2$.

The gate insulating layer 1300 (that is, a ferroelectric layer) may have negative capacitance characteristics owing to the dielectric layer 1700. According to the present example embodiments, the oxide semiconductor transistor 7 may have a large channel length and may use negative capacitance characteristics. Therefore, the oxide semiconductor transistor 7 may have improved electrical characteristics.

Figure 10:
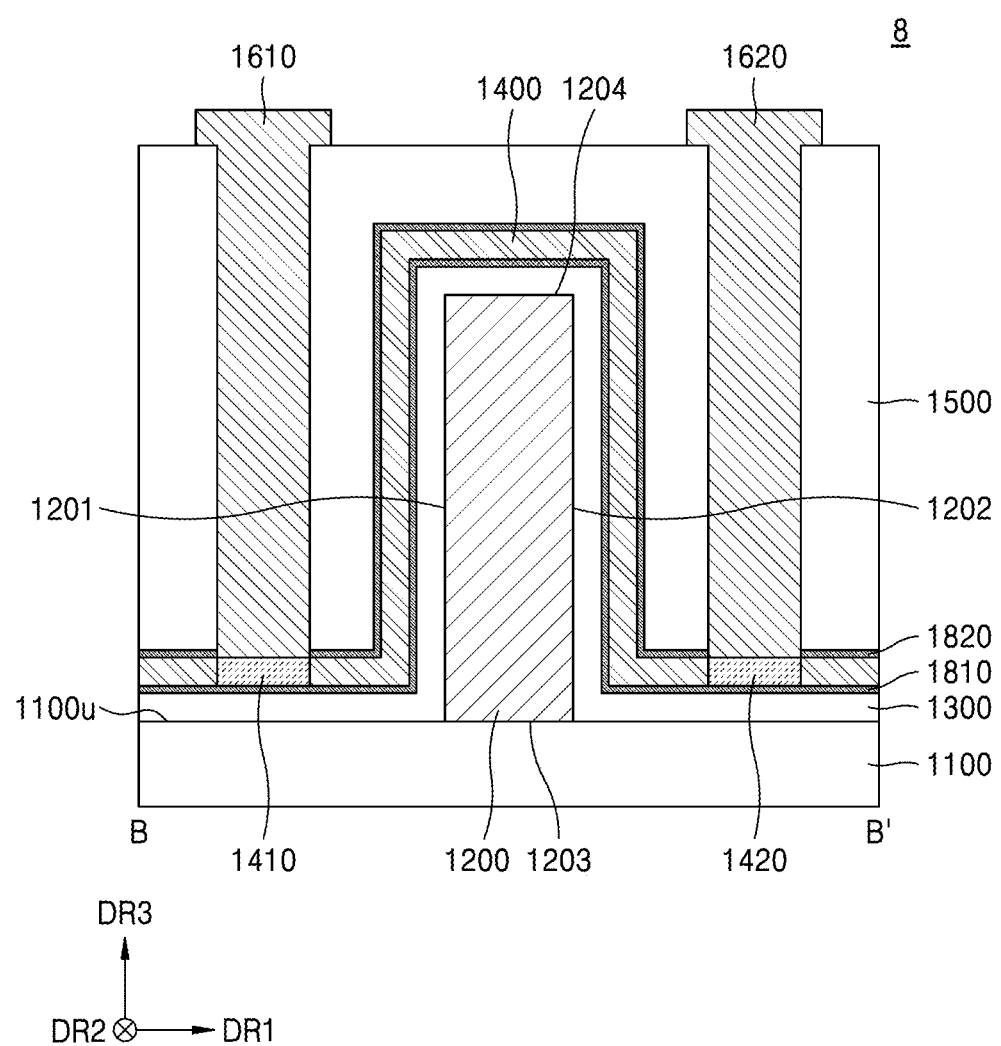
FIG. 10 is a cross-sectional view illustrating an oxide semiconductor transistor according to example embodiments, the cross-sectional view corresponding to line B-B' of FIG. 7.

FIG. 10 is a cross-sectional view illustrating an oxide semiconductor transistor 8 according to example embodiments, the cross-sectional view corresponding to line B-B' of FIG. 7. For clarity of illustration, the same or substantially the same structures as those described with reference to FIGS. 7 and 8 may not be described here.

Referring to FIG. 10, the oxide semiconductor transistor 8 may be provided as follows. The oxide semiconductor transistor 8 may include an insulating substrate 1100, a gate electrode 1200, a gate insulating layer 1300, a lower diffusion barrier 1810, an oxide semiconductor layer 1400, an upper diffusion barrier 1820, and a source electrode 1610, and/or a drain electrode 1620. The insulating substrate 1100, the gate electrode 1200, the gate insulating layer 1300, the oxide semiconductor layer 1400, the source electrode 1610, and the drain electrode 1620 may be the same or substantially the same as the gate electrode 1200, the gate insulating layer 1300, the oxide semiconductor layer 1400, the source electrode 1610, and the drain electrode 1620 which are described with reference to FIGS. 7 and 8.

The lower diffusion barrier 1810 may be provided between the gate insulating layer 1300 and the oxide semiconductor layer 1400. The lower diffusion barrier 1810 may extend along a top surface of the gate insulating layer 1300. The lower diffusion barrier 1810 may extend between a source region 1410 and the gate insulating layer 1300. The lower diffusion barrier 1810 may separate the source region 1410 and the gate insulating layer 1300 from each other. The lower diffusion barrier 1810 may extend between a drain region 1420 and the gate insulating layer 1300. The lower diffusion barrier 1810 may separate the drain region 1420 and the gate insulating layer 1300 from each other. The lower diffusion barrier 1810 may prevent, for example, reduce or prevent hydrogen from permeating into a lower portion of the oxide semiconductor layer 1400. For example, the lower diffusion barrier 1810 may include $Al_2O_3$, SiN, SiON, or a combination thereof.

The upper diffusion barrier 1820 may be provided between the oxide semiconductor layer 1400 and an upper insulating layer 1500. The upper diffusion barrier 1820 may extend along a top surface 1204 of the oxide semiconductor layer 1400. The upper diffusion barrier 1820 may expose the source region 1410 and the drain region 1420. The source electrode 1610 and the drain electrode 1620 may penetrate the upper diffusion barrier 1820. The source electrode 1610 and the drain electrode 1620 may be electrically connected to the source region 1410 and the drain region 1420, respectively through the upper diffusion barrier 1820. The upper diffusion barrier 1820 may prevent, for example, reduce or prevent hydrogen from permeating into an upper portion of the oxide semiconductor layer 1400. For example, the upper diffusion barrier 1820 may include $Al_2O_3$, SiN, SiON, or a combination thereof.

In the present example embodiments, the lower diffusion barrier 1810 and the upper diffusion barrier 1820 may prevent, for example, reduce or prevent hydrogen from permeating into the oxide semiconductor layer 1400, and the oxide semiconductor transistor 8 may have a large channel length. Therefore, the oxide semiconductor transistor 8 may have improved electrical characteristics.

Figure 11:
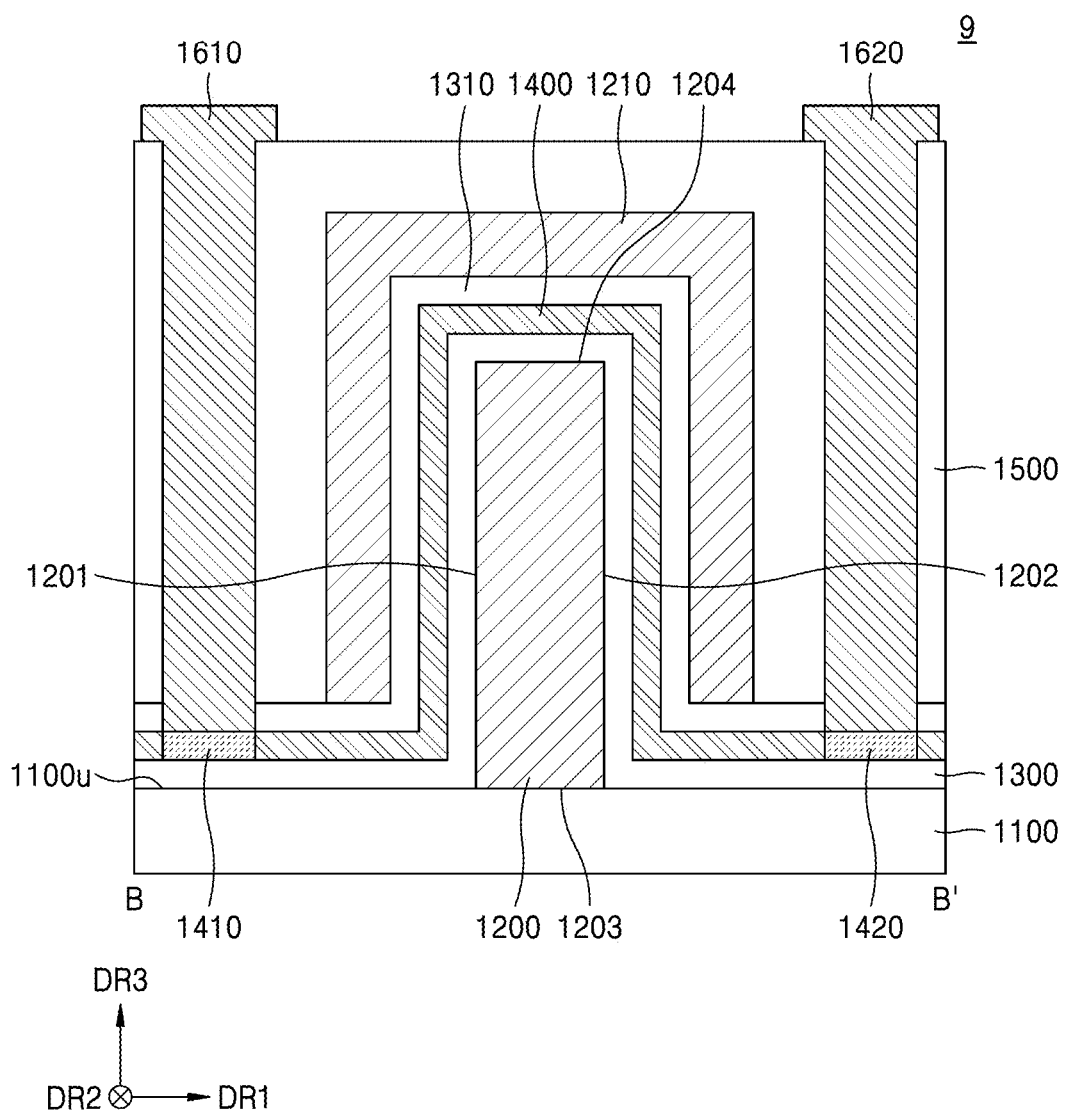
FIG. 11 is a cross-sectional view illustrating an oxide semiconductor transistor according to example embodiments, the cross-sectional view corresponding to line B-B' of FIG. 7.

FIG. 11 is a cross-sectional view illustrating an oxide semiconductor transistor 9 according to example embodiments, the cross-sectional view corresponding to line B-B' of FIG. 7. For clarity of illustration, the same or substantially the same structures as those described with reference to FIGS. 7 and 8 may not be described here.

Referring to FIG. 11, the oxide semiconductor transistor 9 may be provided as follows. The oxide semiconductor transistor 9 may include an insulating substrate 1100, a gate electrode 1200, a gate insulating layer 1300, an oxide semiconductor layer 1400, a third additional gate insulating layer 1310, a third additional gate electrode 1210, an upper insulating layer 1500, a source electrode 1610, and/or a drain electrode 1620. The insulating substrate 1100, the gate electrode 1200, the gate insulating layer 1300, the oxide semiconductor layer 1400, the upper insulating layer 1500, the source electrode 1610, and the drain electrode 1620 may be the same or substantially the same as the insulating substrate 1100, the gate electrode 1200, the gate insulating layer 1300, the oxide semiconductor layer 1400, the upper insulating layer 1500, the source electrode 1610, and the drain electrode 1620 which are described with reference to FIGS. 7 and 8.

The third additional gate insulating layer 1310 may be provided between the oxide semiconductor layer 1400 and the upper insulating layer 1500. The third additional gate insulating layer 1310 may extend along a top surface of the oxide semiconductor layer 1400. For example, the third additional gate insulating layer 1310 may conformally extend along the top surface of the oxide semiconductor layer 1400. The third additional gate insulating layer 1310 may expose a source region 1410 and a drain region 1420. The source electrode 1610 and the drain electrode 1620 may penetrate the third additional gate insulating layer 1310. The source electrode 1610 and the drain electrode 1620 may be electrically connected to the source region 1410 and the drain region 1420, respectively through the third additional gate insulating layer 1310. The thickness of the third additional gate insulating layer 1310 may be determined as needed. The third additional gate insulating layer 1310 may include a ferroelectric material, a dielectric material, or a high-k dielectric material. The ferroelectric material, the dielectric material, and the high-k dielectric material may be the same or substantially the same as those described with reference to FIGS. 7 and 8. In an example, the third additional gate insulating layer 1310 may have the same or substantially the same thickness and material as the gate insulating layer 1300.

The third additional gate electrode 1210 may be provided on the third additional gate insulating layer 1310. The third additional gate electrode 1210 may be arranged on a side of the oxide semiconductor layer 1400 which is opposite the third additional gate insulating layer 1310. The third additional gate electrode 1210 may face a first lateral surface 1201, a second lateral surface 1202, and a top surface 1204 of the gate electrode 1200. The third additional gate electrode 1210 may be electrically disconnected from the oxide semiconductor layer 1400. The third additional gate electrode 1210 may be separated from the oxide semiconductor layer 1400 by the third additional gate insulating layer 1310. The third additional gate electrode 1210 may include an electrically conductive material. For example, the third additional gate electrode 1210 may include a metal or a metal compound.

The gate electrode 400 and the third additional gate electrode 1210 may be gate electrodes of a double gate structure. The oxide semiconductor transistor 9 of the present example embodiments may have a double gate structure and a large channel length. Therefore, the oxide semiconductor transistor 9 may have improved electrical characteristics.

Figure 12:
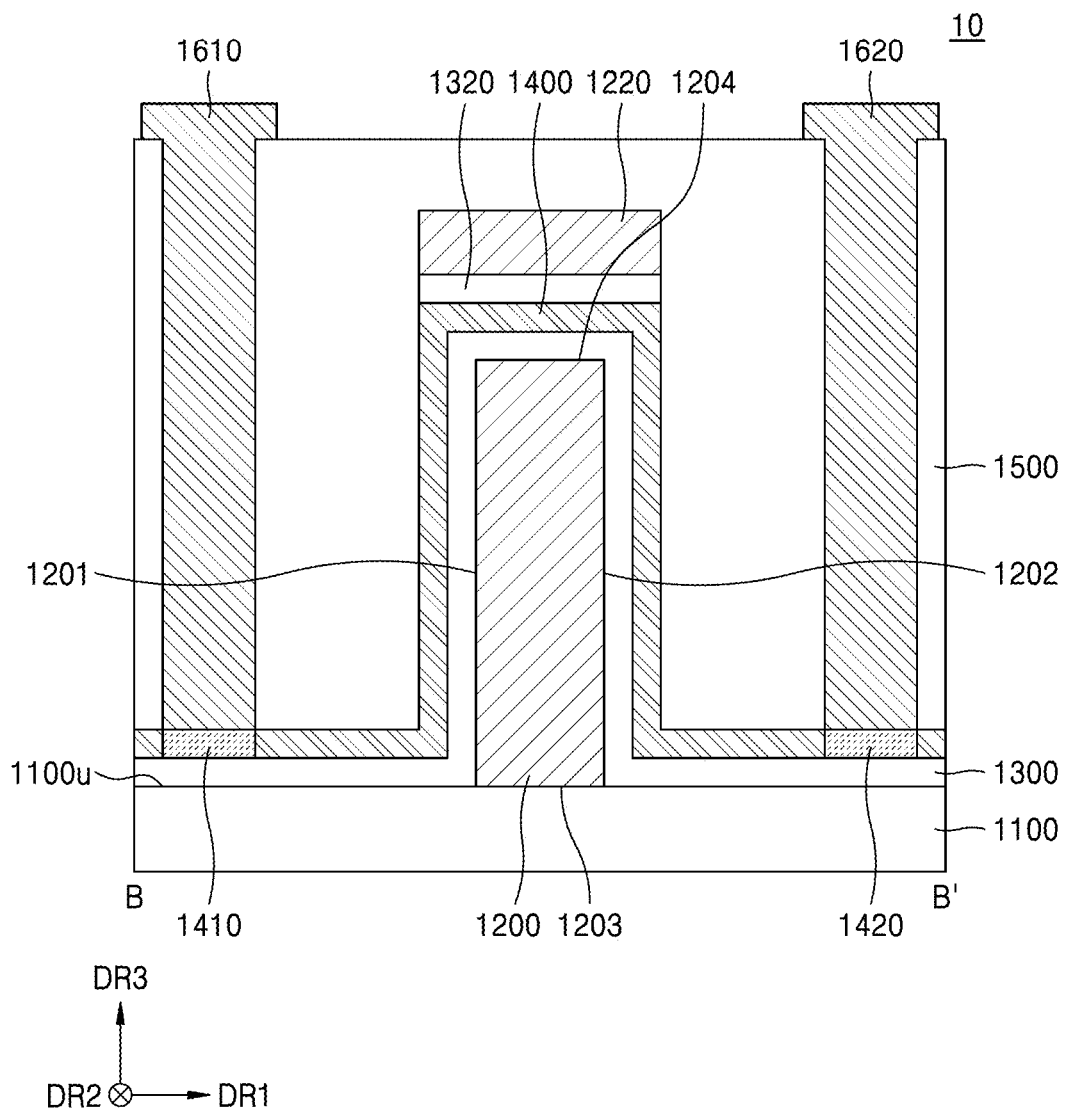
FIG. 12 is a cross-sectional view illustrating an oxide semiconductor transistor according to example embodiments, the cross-sectional view corresponding to line B-B' of FIG. 7.

FIG. 12 is a cross-sectional view illustrating an oxide semiconductor transistor 10 according to example embodiments, the cross-sectional view corresponding to line B-B' of FIG. 7. For clarity of illustration, the same or substantially the same structures as those described with reference to FIGS. 7 and 8 may not be described here.

Referring to FIG. 12, the oxide semiconductor transistor 10 may be provided as follows. The oxide semiconductor transistor 10 may include an insulating substrate 1100, a gate electrode 1200, a gate insulating layer 1300, an oxide semiconductor layer 1400, a fourth additional gate insulating layer 1320, a fourth additional gate electrode 1220, an upper insulating layer 1500, a source electrode 1610, and/or a drain electrode 1620. The insulating substrate 1100, the gate electrode 1200, the gate insulating layer 1300, the oxide semiconductor layer 1400, the upper insulating layer 1500, the source electrode 1610, and the drain electrode 1620 may be the same or substantially the same as the insulating substrate 1100, the gate electrode 1200, the gate insulating layer 1300, the oxide semiconductor layer 1400, the upper insulating layer 1500, the source electrode 1610, and the drain electrode 1620 which are described with reference to FIGS. 7 and 8.

The fourth additional gate insulating layer 1320 may be provided above a top surface 1204 of the gate electrode 1200. The fourth additional gate insulating layer 1320 may be provided above the top surface 1204 of the gate electrode 1200 at a side of the oxide semiconductor layer 1400 which is opposite the gate insulating layer 1300. The fourth additional gate insulating layer 1320 may extend along a top surface of the oxide semiconductor layer 1400. The top surface of the oxide semiconductor layer 1400 may be opposite a bottom surface of the oxide semiconductor layer 1400 which faces the gate insulating layer 1300. The thickness of the fourth additional gate insulating layer 1320 may be determined as necessary. The fourth additional gate insulating layer 1320 may include a ferroelectric material, a dielectric material, or a high-k dielectric material. The ferroelectric material, the dielectric material, and the high-k dielectric material may be the same or substantially the same as those described with reference to FIGS. 7 and 8. In an example, the fourth additional gate insulating layer 1320 may have the same or substantially the same thickness and material as the gate insulating layer 1300.

The fourth additional gate electrode 1220 may be provided on the fourth additional gate insulating layer 1320. The fourth additional gate electrode 1220 may be provided on a side of the fourth additional gate insulating layer 1320 which is opposite the oxide semiconductor layer 1400. The fourth additional gate electrode 1220 may be electrically disconnected from the oxide semiconductor layer 1400. The fourth additional gate electrode 1220 may be separated from the oxide semiconductor layer 1400 by the fourth additional gate insulating layer 1320. The fourth additional gate electrode 1220 may include an electrically conductive material. For example, the fourth additional gate electrode 1220 may include a metal or a metal compound.

The gate electrode 1200 and the fourth additional gate electrode 1220 may be gate electrodes of a double gate structure. The oxide semiconductor transistor 10 of the present example embodiments may have a double gate structure and a large channel length. Therefore, the oxide semiconductor transistor 10 may have improved electrical characteristics.

Figure 13:
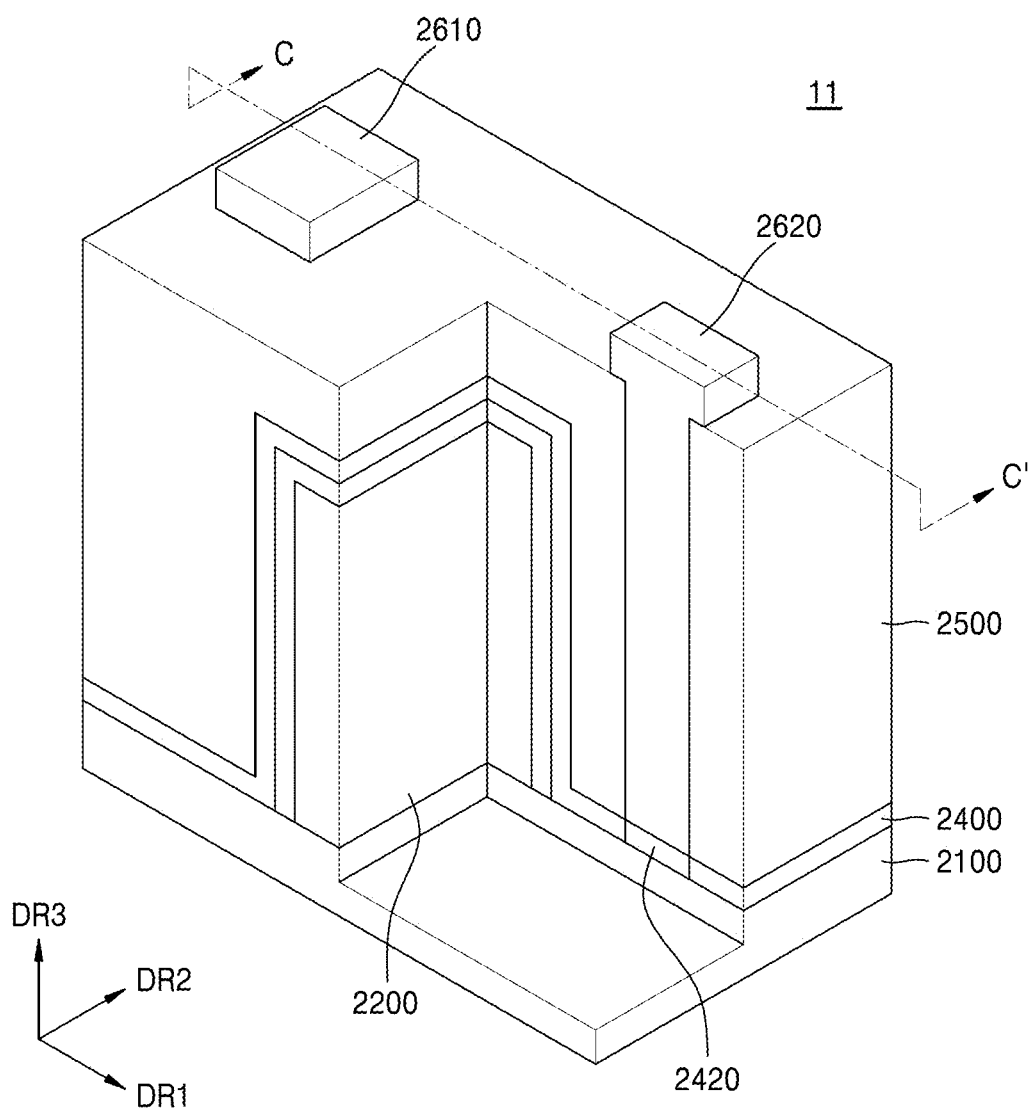
FIG. 13 is a perspective view of an oxide semiconductor transistor according to example embodiments.
Figure 14:
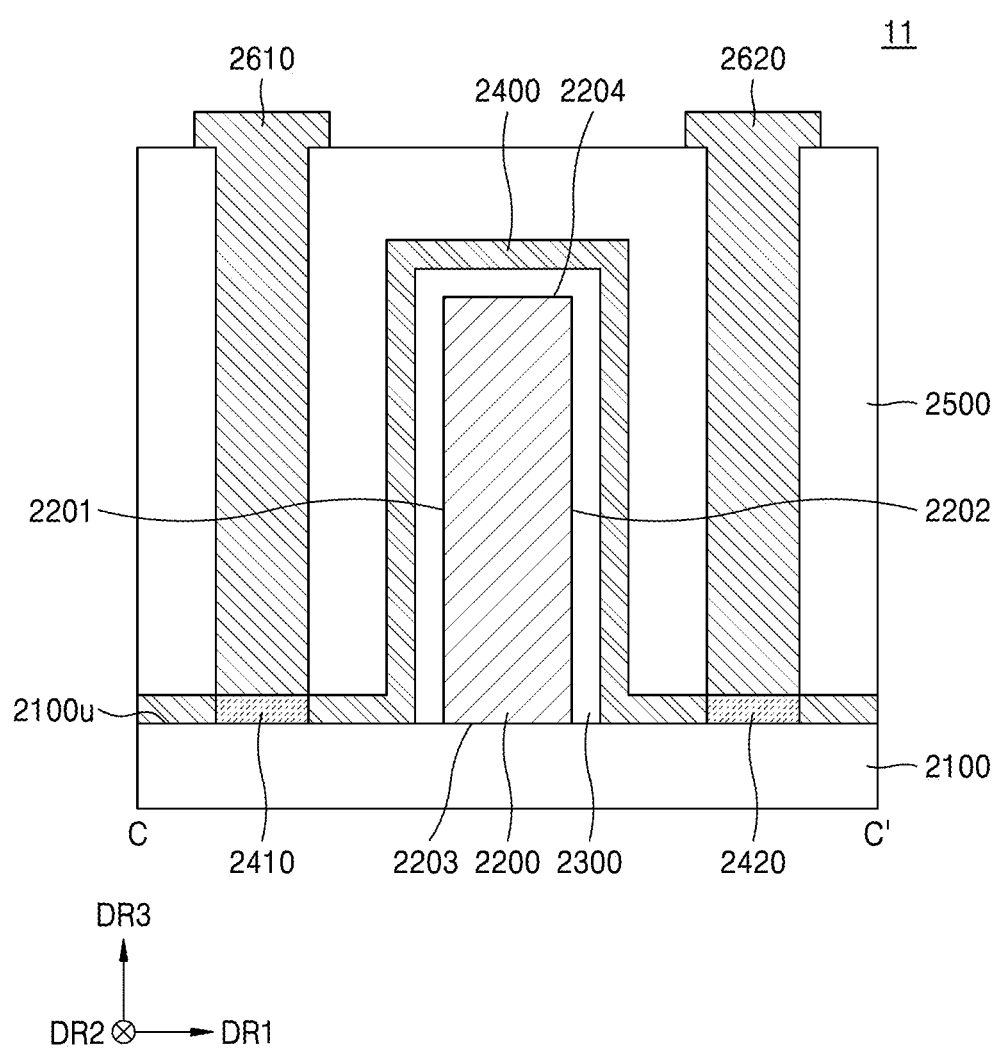
FIG. 14 is a cross-sectional view taken along line C-C' of FIG. 13.

FIG. 13 is a perspective view of an oxide semiconductor transistor 11 according to example embodiments. FIG. 14 is a cross-sectional view taken along line C-C' of FIG. 13. For clarity of illustration, the same or substantially the same structures as those described with reference to FIGS. 7 and 8 may not be described here.

Referring to FIGS. 13 and 14, the oxide semiconductor transistor 11 may be provided as follows. The oxide semiconductor transistor 11 may include an insulating substrate 2100, a gate electrode 2200, a gate insulating layer 2300, an oxide semiconductor layer 2400, an upper insulating layer 2500, a source electrode 2610, and/or a drain electrode 2620. The insulating substrate 2100, the gate electrode 2200, the oxide semiconductor layer 2400, the upper insulating layer 2500, the source electrode 2610, and the drain electrode 2620 may be the same or substantially the same as the insulating substrate 2100, the gate electrode 2200, the oxide semiconductor layer 2400, the upper insulating layer 2500, the source electrode 2610, and the drain electrode 2620 which are described with reference to FIGS. 7 and 8.

Unlike in the description given with reference to FIGS. 7 and 8, the gate insulating layer 2300 may not be provided between a top surface 2100u of the insulating substrate 2100 and a bottom surface of the oxide semiconductor layer 2400. Both end surfaces of the gate insulating layer 2300 which are opposite each other in the extending direction of the gate insulating layer 2300 may be in direct contact with the top surface 2100u of the insulating substrate 2100. The bottom surface of the oxide semiconductor layer 2400 may be in direct contact with the top surface 2100u of the insulating substrate 2100. A source region 2410 and a drain region 2420 may be in direct contact with the insulating substrate 2100.

Since the oxide semiconductor layer 2400 of the present example embodiments extends along a first lateral surface 2201, a second lateral surface 2202, and a top surface 2204 of the gate electrode 2200, the channel length of the oxide semiconductor transistor 11 may be greater than the distance between the source region 2410 and the drain region 2420 in a first direction DR1. Therefore, the oxide semiconductor transistor 11 of the present example embodiments may have a large channel length. As a result, the oxide semiconductor transistor 11 may have improved electrical characteristics.

Figure 15:
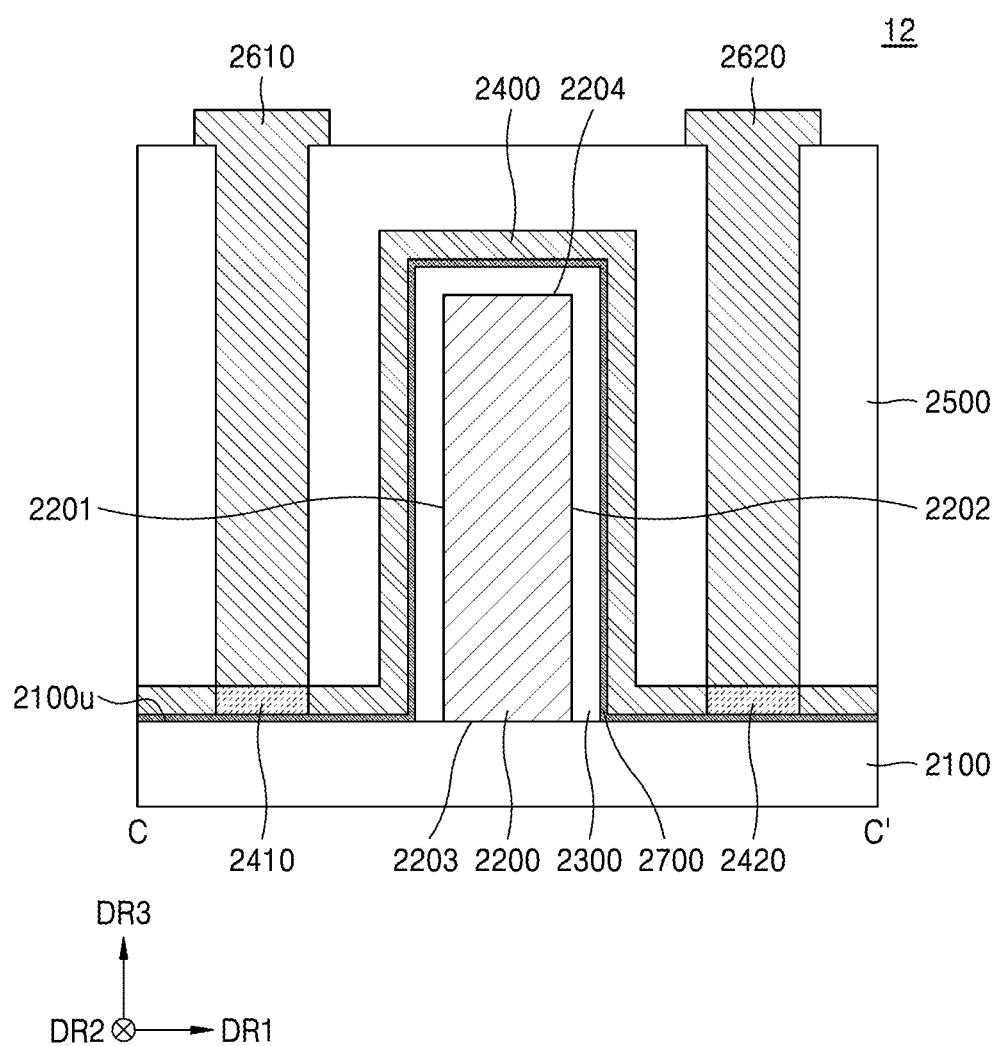
FIG. 15 is a cross-sectional view illustrating an oxide semiconductor transistor according to example embodiments, the cross-sectional view corresponding to line C-C' of FIG. 13.

FIG. 15 is a cross-sectional view illustrating an oxide semiconductor transistor 12 according to example embodiments, the cross-sectional view corresponding to line C-C' of FIG. 13. For clarity of illustration, the same or substantially the same structures as those described with reference to FIGS. 13 and 14 may not be described here.

Referring to FIG. 15, the oxide semiconductor transistor 12 may be provided as follows. The oxide semiconductor transistor 12 may include an insulating substrate 2100, a gate electrode 2200, a gate insulating layer 2300, a dielectric layer 2700, an oxide semiconductor layer 2400, an upper insulating layer 2500, a source electrode 2610, and/or a drain electrode 2620. The insulating substrate 2100, the gate electrode 2200, the gate insulating layer 2300, the oxide semiconductor layer 2400, the upper insulating layer 2500, the source electrode 2610, and the drain electrode 2620 may be the same or substantially the same as the insulating substrate 2100, the gate electrode 2200, the gate insulating layer 2300, the dielectric layer 2700, the oxide semiconductor layer 2400, the upper insulating layer 2500, the source electrode 2610, and the drain electrode 2620 which are described with reference to FIGS. 13 and 14.

The gate insulating layer 2300 may be a ferroelectric layer. In other words, the gate insulating layer 2300 may not include a dielectric material or a high-k dielectric material.

The dielectric layer 2700 may extend along a bottom surface of the oxide semiconductor layer 2400. The dielectric layer 2700 may be provided between the gate insulating layer 2300 and the oxide semiconductor layer 2400 above a first lateral surface 2201, a second lateral surface 2202, and a top surface 2204 of the gate electrode 2200. The dielectric layer 2700 may be provided between the oxide semiconductor layer 2400 and the insulating substrate 2100 above the top surface 2100u of the insulating substrate 2100. The dielectric layer 2700 may extend between a source region 2410 and the insulating substrate 2100. The dielectric layer 2700 may separate the source region 2410 and the insulating substrate 2100 from each other. The dielectric layer 2700 may extend between a drain region 2420 and the insulating substrate 2100. The dielectric layer 2700 may separate the drain region 2420 and the insulating substrate 2100 from each other. The dielectric layer 2700 may be in direct contact with the drain region 2420. The thickness of the dielectric layer 2700 may be determined as needed. For example, the dielectric layer 2700 may include a material having a high dielectric constant. The high dielectric constant may refer to a dielectric constant greater than the electric constant of a silicon oxide. In some example embodiments, the dielectric layer 2700 may include a metal oxide containing at least one metal selected from the group consisting of calcium (Ca), strontium (Sr), barium (Ba), scandium (Sc), yttrium (Y), lanthanum (La), titanium (Ti), hafnium (Hf), zirconium (Zr), niobium (Nb), tantalum (Ta), cerium (Ce), praseodymium (Pr), neodymium (Nd), gadolinium (Gd), dysprosium (Dy), ytterbium (Yb), and lutetium (Lu). For example, the dielectric layer 2700 may include $HfO_2$, $ZrO_2$, $CeO_2$, $La_2O_3$, $Ta_2O_3$, or $TiO_2$.

The gate insulating layer 2300 (that is, a ferroelectric layer) may have negative capacitance characteristics owing to the dielectric layer 2700. According to the present example embodiments, the oxide semiconductor transistor 12 may have a large channel length and may use negative capacitance characteristics. Therefore, the oxide semiconductor transistor 12 may have improved electrical characteristics.

Figure 16:
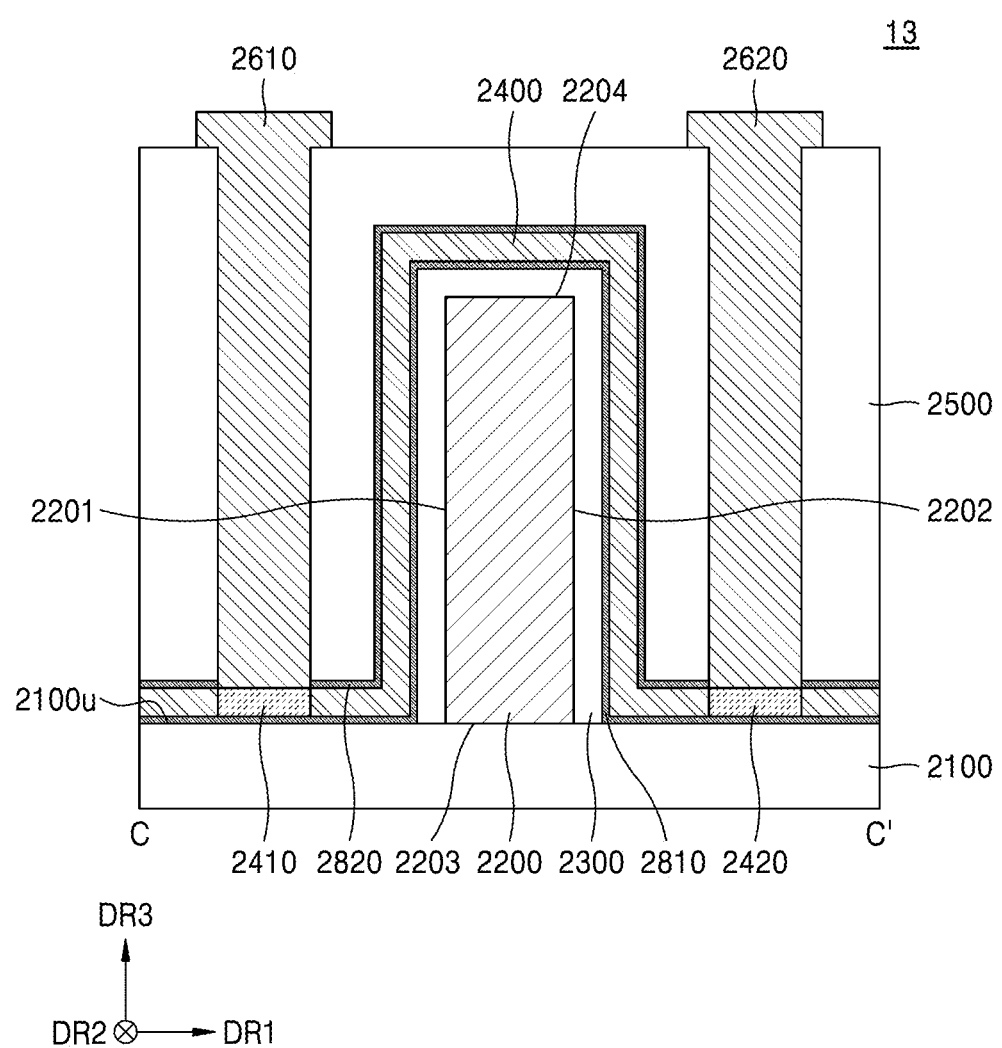
FIG. 16 is a cross-sectional view illustrating an oxide semiconductor transistor according to example embodiments, the cross-sectional view corresponding to line C-C' of FIG. 13.

FIG. 16 is a cross-sectional view illustrating an oxide semiconductor transistor 13 according to example embodiments, the cross-sectional view corresponding to line C-C' of FIG. 13. For clarity of illustration, the same or substantially the same structures as those described with reference to FIGS. 13 and 14 may not be described here.

Referring to FIG. 16, the oxide semiconductor transistor 13 may be provided as follows. The oxide semiconductor transistor 13 may include an insulating substrate 2100, a gate electrode 2200, a gate insulating layer 2300, a lower diffusion barrier 2810, an oxide semiconductor layer 2400, an upper diffusion barrier 2820, an upper insulating layer 2500, a source electrode 2610, and/or a drain electrode 2620. The insulating substrate 2100, the gate electrode 2200, the gate insulating layer 2300, the oxide semiconductor layer 2400, the source electrode 2610, and the drain electrode 2620 may be the same or substantially the same as the insulating substrate 2100, the gate electrode 2200, the gate insulating layer 2300, the oxide semiconductor layer 2400, the source electrode 2610, and the drain electrode 2620 which are described with reference to FIGS. 13 and 14.

The lower diffusion barrier 2810 may extend along a bottom surface of the oxide semiconductor layer 2400. The lower diffusion barrier 2810 may be provided between the gate insulating layer 2300 and the oxide semiconductor layer 2400 above a first lateral surface 2201, a second lateral surface 2202, and a top surface 2204 of the gate electrode 2200. The lower diffusion barrier 2810 may be provided between the oxide semiconductor layer 2400 and the insulating substrate 2100 above a top surface 2100u of the insulating substrate 2100. The lower diffusion barrier 2810 may extend between a source region 2410 and the insulating substrate 2100. The lower diffusion barrier 2810 may prevent, for example, reduce or prevent hydrogen from permeating into a lower portion of the oxide semiconductor layer 2400. For example, the lower diffusion barrier 2810 may include $Al_2O_3$, SiN, SiON, or a combination thereof.

The upper diffusion barrier 2820 may be provided between the oxide semiconductor layer 2400 and the upper insulating layer 2500. The upper diffusion barrier 2820 may extend along a top surface of the oxide semiconductor layer 2400. The upper diffusion barrier 2820 may expose the source region 2410 and a drain region 2420. The source electrode 2610 and the drain electrode 2620 may penetrate the upper diffusion barrier 2820. The source electrode 2610 and the drain electrode 2620 may be electrically connected to the source region 2410 and the drain region 2420, respectively through the upper diffusion barrier 2820. The upper diffusion barrier 2820 may prevent, for example, reduce or prevent hydrogen from permeating into an upper portion of the oxide semiconductor layer 2400. For example, the upper diffusion barrier 2820 may include $Al_2O_3$, SiN, SiON, or a combination thereof.

In the present example embodiments, the lower diffusion barrier 2810 and the upper diffusion barrier 2820 may prevent, for example, reduce or prevent hydrogen from permeating into the oxide semiconductor layer 2400, and the oxide semiconductor transistor 13 may have a large channel length. Therefore, the oxide semiconductor transistor 13 may have improved electrical characteristics.

Figure 17:
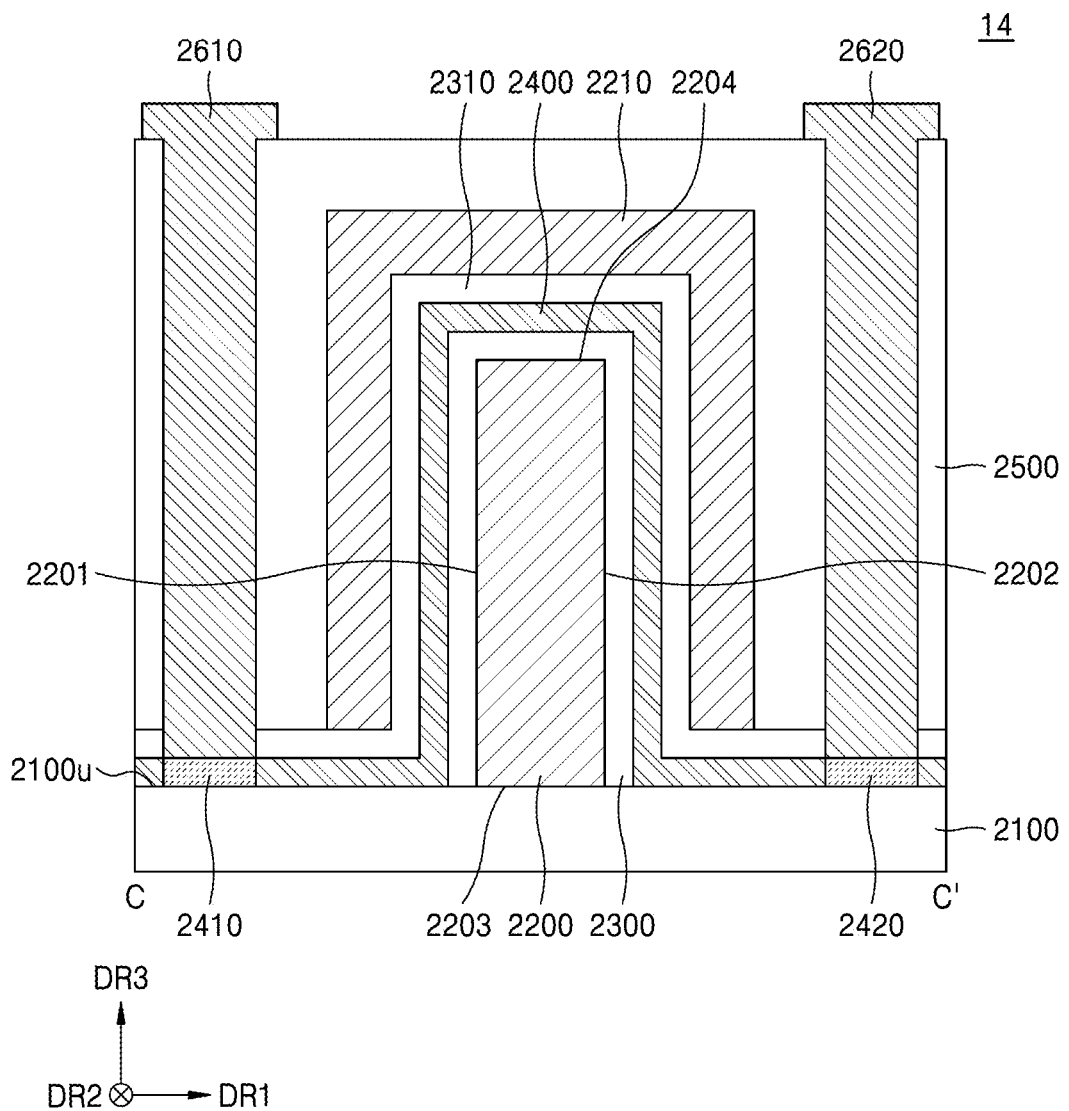
FIG. 17 is a cross-sectional view illustrating an oxide semiconductor transistor according to example embodiments, the cross-sectional view corresponding to line C-C' of FIG. 13.

FIG. 17 is a cross-sectional view illustrating an oxide semiconductor transistor 14 according to example embodiments, the cross-sectional view corresponding to line C-C' of FIG. 13. For clarity of illustration, the same or substantially the same structures as those described with reference to FIG. 11 and reference to FIGS. 13 and 14 may not be described here.

Referring to FIG. 17, the oxide semiconductor transistor 14 may be provided as follows. The oxide semiconductor transistor 14 may include an insulating substrate 2100, a gate electrode 2200, a gate insulating layer 2300, an oxide semiconductor layer 2400, a fifth additional gate insulating layer 2310, a fifth additional gate electrode 2210, an upper insulating layer 2500, a source electrode 2610, and/or a drain electrode 2620. The insulating substrate 2100, the gate electrode 2200, the gate insulating layer 2300, the oxide semiconductor layer 2400, the upper insulating layer 2500, the source electrode 2610, and the drain electrode 2620 may be the same or substantially the same as the insulating substrate 2100, the gate electrode 2200, the gate insulating layer 2300, the oxide semiconductor layer 2400, the upper insulating layer 2500, the source electrode 2610, and the drain electrode 2620 which are described with reference to FIGS. 13 and 14.

The fifth additional gate insulating layer 2310 and the fifth additional gate electrode 2210 may be the same or substantially the same as the third additional gate insulating layer 1310 and the third additional gate electrode 1210 described with reference to FIG. 11.

The gate electrode 2200 and the fifth additional gate electrode 2210 may be gate electrodes of a double gate structure. The oxide semiconductor transistor 14 of the present example embodiments may have a double gate structure and a large channel length. Therefore, the oxide semiconductor transistor 14 may have improved electrical characteristics.

Figure 18:
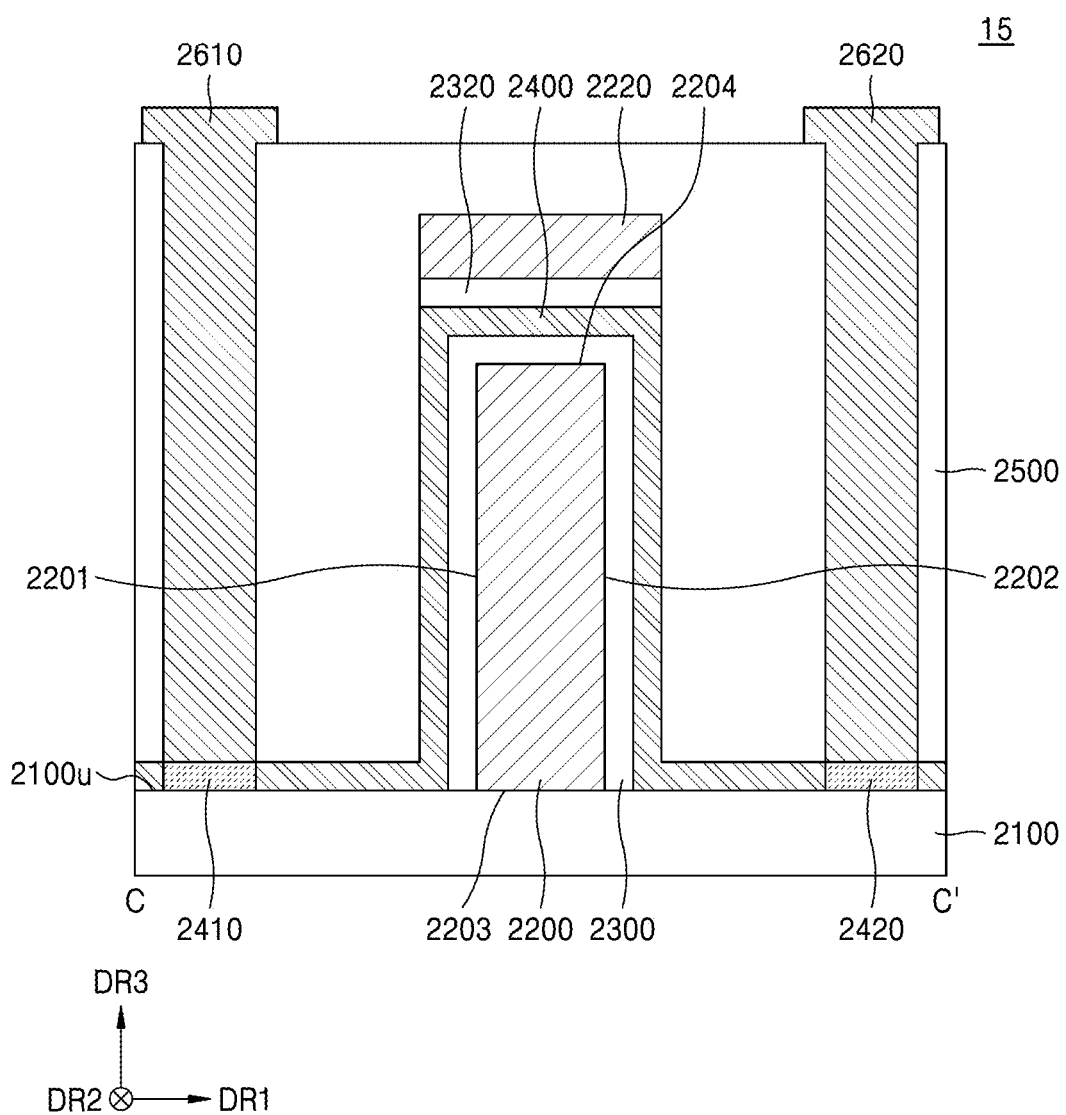
FIG. 18 is a cross-sectional view illustrating an oxide semiconductor transistor according to example embodiments, the cross-sectional view corresponding to line C-C' of FIG. 13.

FIG. 18 is a cross-sectional view illustrating an oxide semiconductor transistor 15 according to example embodiments, the cross-sectional view corresponding to line C-C' of FIG. 13. For clarity of illustration, the same or substantially the same structures as those described with reference to FIG. 12 and reference to FIGS. 13 and 14 may not be described here.

Referring to FIG. 18, the oxide semiconductor transistor 15 may be provided as follows. The oxide semiconductor transistor 15 may include an insulating substrate 2100, a gate electrode 2200, a gate insulating layer 2300, an oxide semiconductor layer 2400, a sixth additional gate insulating layer 2320, a sixth additional gate electrode 2220, an upper insulating layer 2500, a source electrode 2610, and/or a drain electrode 2620. The insulating substrate 2100, the gate electrode 2200, the gate insulating layer 2300, the oxide semiconductor layer 2400, the upper insulating layer 2500, the source electrode 2610, and the drain electrode 2620 may be the same or substantially the same as the insulating substrate 2100, the gate electrode 2200, the gate insulating layer 2300, the oxide semiconductor layer 2400, the upper insulating layer 2500, the source electrode 2610, and the drain electrode 2620 which are described with reference to FIGS. 13 and 14.

The sixth additional gate insulating layer 2320 and the sixth additional gate electrode 2220 may be the same or substantially the same as the fourth additional gate insulating layer 1320 and the fourth additional gate electrode 1220 described with reference to FIG. 12.

The gate electrode 2200 and the sixth additional gate electrode 2220 may be gate electrodes of a double gate structure. The oxide semiconductor transistor 15 of the present example embodiments may have a double gate structure and a large channel length. Therefore, the oxide semiconductor transistor 15 may have improved electrical characteristics.

As described above, the present disclosure provides oxide semiconductor transistors having improved electrical characteristics.

However, effects of the present disclosure are not limited thereto.

It should be understood that example embodiments described herein should be considered in a descriptive sense only and not for purposes of limitation. Descriptions of features or aspects within example embodiments should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. An oxide semiconductor transistor comprising:
an insulating substrate comprising a trench;
a gate electrode in the trench;
an oxide semiconductor layer on a surface of the insulating substrate, the surface exposed through the trench; and
a ferroelectric layer between the gate electrode and the oxide semiconductor layer,
wherein the oxide semiconductor layer comprises a source region and a drain region on the insulating substrate outside the trench apart from each other with the gate electrode therebetween.

2. The oxide semiconductor transistor of claim 1, wherein the ferroelectric layer extends along both lateral surfaces and a bottom surface of the gate electrode.

3. The oxide semiconductor transistor of claim 2, wherein the ferroelectric layer further extends onto a top surface of the gate electrode.

4. The oxide semiconductor transistor of claim 3, wherein the ferroelectric layer completely covers the top surface of the gate electrode.

5. The oxide semiconductor transistor of claim 1, wherein the ferroelectric layer extends along the oxide semiconductor layer outside the trench and exposes the source region and the drain region.

6. The oxide semiconductor transistor of claim 1, further comprising a dielectric layer between the oxide semiconductor layer and the ferroelectric layer, wherein the ferroelectric layer and the dielectric layer have negative capacitance characteristics.

7. The oxide semiconductor transistor of claim 6, wherein the ferroelectric layer and the dielectric layer extend along the oxide semiconductor layer outside the trench and exposes the source region and the drain region.

8. The oxide semiconductor transistor of claim 1, further comprising a first diffusion barrier between the oxide semiconductor layer and the insulating substrate,
wherein the first diffusion barrier prevents hydrogen from permeating into the oxide semiconductor layer.

9. The oxide semiconductor transistor of claim 8, wherein the first diffusion barrier extends between the insulating substrate and the source region and between the insulating substrate and the drain region.

10. The oxide semiconductor transistor of claim 1, further comprising a second diffusion barrier between the oxide semiconductor layer and the ferroelectric layer,
wherein the second diffusion barrier prevents hydrogen from permeating into the oxide semiconductor layer.

11. The oxide semiconductor transistor of claim 10, wherein the second diffusion barrier extends along the oxide semiconductor layer outside the trench and exposes the source region and the drain region.

12. The oxide semiconductor transistor of claim 1, further comprising:
an additional gate electrode on a side of the oxide semiconductor layer, the side opposite the gate electrode; and
an additional gate insulating layer between the additional gate electrode and the oxide semiconductor layer.

13. The oxide semiconductor transistor of claim 12, wherein the additional gate electrode and the additional gate insulating layer are along a bottom surface of the gate electrode.

14. The oxide semiconductor transistor of claim 13, wherein the additional gate electrode and the additional gate insulating layer extend along both lateral surfaces of the gate electrode.

15. The oxide semiconductor transistor of claim 14, wherein the additional gate electrode and the additional gate insulating layer separate the oxide semiconductor layer from the surface of the insulating substrate exposed through the trench.

16. The oxide semiconductor transistor of claim 1, further comprising:
a source electrode on the source region; and
a drain electrode on the drain region,
wherein the source electrode and the drain electrode are electrically connected to the source region and the drain region, respectively.

17. The oxide semiconductor transistor of claim 16, wherein
the ferroelectric layer extends along the oxide semiconductor layer outside the trench, and
the source electrode and the drain electrode penetrate the ferroelectric layer and make direct contact with the source region and the drain region, respectively,
wherein the ferroelectic layer is in direct contact with a top surface of, a bottom surface of, and a first and second sidewall of the gate electrode.

18. An oxide semiconductor transistor comprising:
an insulating substrate;
a gate electrode on the insulating substrate;
an oxide semiconductor layer on the insulating substrate to cover the gate electrode; and
a gate insulating layer between the gate electrode and the oxide semiconductor layer,
wherein the oxide semiconductor layer comprises a source region and a drain region apart from each other with the gate electrode therebetween.

19. The oxide semiconductor transistor of claim 18, wherein the oxide semiconductor layer and the gate insulating layer extend along both lateral surfaces and a top surface of the gate electrode.

20. The oxide semiconductor transistor of claim 19, wherein the oxide semiconductor layer is separate from the insulating substrate by the gate insulating layer.

21. The oxide semiconductor transistor of claim 20, wherein the gate insulating layer overlaps the source region and the drain region in a direction perpendicular to a top surface of the insulating substrate.

22. The oxide semiconductor transistor of claim 19, further comprising a dielectric layer between the oxide semiconductor layer and the gate insulating layer,
wherein the gate insulating layer comprises a ferroelectric material.

23. The oxide semiconductor transistor of claim 19, further comprising a first diffusion barrier between the oxide semiconductor layer and the gate insulating layer,
wherein the first diffusion barrier prevents hydrogen from permeating into the oxide semiconductor layer.

24. The oxide semiconductor transistor of claim 19, further comprising a second diffusion barrier on the oxide semiconductor layer,
wherein the second diffusion barrier prevents hydrogen from permeating into the oxide semiconductor layer.

25. The oxide semiconductor transistor of claim 24, wherein the second diffusion barrier extends along the oxide semiconductor layer and exposes the source region and the drain region.

26. The oxide semiconductor transistor of claim 19, wherein
the gate insulating layer comprises a pair of end surfaces opposite each other in an extending direction of the gate insulating layer, and
the pair of end surfaces of the gate insulating layer are in direct contact with a top surface of the insulating substrate.

27. The oxide semiconductor transistor of claim 26, wherein the source region and the drain region are in direct contact with the top surface of the insulating substrate.

28. The oxide semiconductor transistor of claim 18, further comprising:
a source electrode on the source region; and
a drain electrode on the drain region,
wherein the source electrode and the drain electrode are electrically connected to the source region and the drain region, respectively.

29. The oxide semiconductor transistor of claim 28, further comprising an upper insulating layer on the oxide semiconductor layer, wherein the source electrode and the drain electrode penetrate the upper insulating layer and are electrically connected to the source region and the drain region, respectively.

30. The oxide semiconductor transistor of claim 18, further comprising:
an additional gate electrode on a side of the oxide semiconductor layer, the side opposite the gate electrode; and
an additional gate insulating layer between the additional gate electrode and the oxide semiconductor layer.

31. The oxide semiconductor transistor of claim 30, wherein the additional gate electrode and the additional gate insulating layer are along a top surface of the gate electrode.

32. The oxide semiconductor transistor of claim 30, wherein the additional gate electrode and the additional gate insulating layer are along both lateral surfaces and a top surface of the gate electrode.

33. The oxide semiconductor transistor of claim 32, wherein the additional gate insulating layer extends along the oxide semiconductor layer and exposes the source region and the drain region.

34. The oxide semiconductor device of claim 1, wherein the insulating substrate is one of a silicon oxide substrate, a silicon nitride substrate, or a silicon oxynitride substrate.

* * * * *